US009349675B2

(12) United States Patent
Kaneda

(10) Patent No.: US 9,349,675 B2
(45) Date of Patent: May 24, 2016

(54) SEMICONDUCTOR DEVICE AND METHOD OF MANUFACTURING THE SAME

(71) Applicant: Renesas Electronics Corporation, Tokyo (JP)

(72) Inventor: Yoshiharu Kaneda, Tokyo (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/961,589

(22) Filed: Dec. 7, 2015

(65) Prior Publication Data

US 2016/0086875 A1 Mar. 24, 2016

Related U.S. Application Data

(62) Division of application No. 14/829,422, filed on Aug. 18, 2015, now Pat. No. 9,240,368, which is a division of application No. 14/065,242, filed on Oct. 28, 2013, now Pat. No. 9,147,647.

(30) Foreign Application Priority Data

Nov. 5, 2012 (JP) ................................. 2012-243289

(51) Int. Cl.
*H01L 23/495* (2006.01)
*H01L 23/00* (2006.01)

(52) U.S. Cl.
CPC .... *H01L 23/49503* (2013.01); *H01L 23/49541* (2013.01); *H01L 24/83* (2013.01); *H01L 24/85* (2013.01); *H01L 24/92* (2013.01); *H01L 2224/32245* (2013.01); *H01L 2224/48175* (2013.01); *H01L 2224/85439* (2013.01); *H01L 2224/85455* (2013.01); *H01L 2224/92247* (2013.01)

(58) Field of Classification Search
CPC .......... H01L 2224/45144; H01L 2924/01079; H01L 2224/48247; H01L 2924/01078; H01L 2924/14
USPC .......................................... 438/123; 257/676
See application file for complete search history.

(56) References Cited

U.S. PATENT DOCUMENTS

| 6,534,878 B1 | 3/2003 | Sander et al. |
| 7,923,827 B2 * | 4/2011 | Heng .................... H01L 21/565 257/676 |
| 2007/0057350 A1 | 3/2007 | Otremba |

FOREIGN PATENT DOCUMENTS

| JP | H3-198356 A | 8/1991 |
| JP | H3-109818 | 11/1991 |

(Continued)

OTHER PUBLICATIONS

U.S. Office Action dated Feb. 13, 2015 in U.S. Appl. No. 14/065,242.

(Continued)

*Primary Examiner* — Walter H Swanson
(74) *Attorney, Agent, or Firm* — McGinn IP Law Group, PLLC

(57) ABSTRACT

A method of manufacturing a semiconductor device includes preparing a lead frame provided with a die pad having an upper surface and a plurality of leads being arranged so as to be aligned on a side of the die pad and each including a wire joint part at a distal end on the side of the die pad, after the preparing the lead frame, mounting a semiconductor chip having a main surface and a plurality of electrode pads formed on the main surface, on the upper surface of the die pad, and after the mounting the semiconductor chip, electrically connecting a first electrode pad among the plurality of electrode pads of the semiconductor chip and a first lead among the plurality of leads to each other via a first wire.

4 Claims, 18 Drawing Sheets

(56) References Cited

FOREIGN PATENT DOCUMENTS

| | | |
|---|---|---|
| JP | H8-213420 | 8/1996 |
| JP | 2000-503491 A | 3/2000 |
| JP | 2003-209132 A | 7/2003 |
| JP | 2007-294530 A | 11/2007 |

OTHER PUBLICATIONS

U.S. Notice of Allowance dated May 28, 2015 in U.S. Appl. No. 14/065,242.
U.S. Notice of Allowance dated Sep. 14, 2015 in U.S. Appl. No. 14/829,422.

* cited by examiner

SEMICONDUCTOR DEVICE AND METHOD OF MANUFACTURING THE SAME

The present application is a Divisional application of U.S. patent application Ser. No. 14/829,422, filed on Aug. 18, 2015, which is a Divisional application of U.S. patent application Ser. No. 14/065,242, filed on Oct. 28, 2013, now U.S. Pat. No. 9,147,647, issued on Sep. 29, 2015, which is based on and claims priority from Japanese patent application No. 2012-243289, filed on Nov. 5, 2012, the entire contents of which are incorporated herein by reference.

TECHNICAL FIELD OF THE INVENTION

The present invention relates to a semiconductor device and a technique of manufacturing the same, and the present invention relates to a technique effectively applied to, for example, a semiconductor device using wires having two types of diameters and to assembly of the semiconductor device.

BACKGROUND OF THE INVENTION

As a lead frame assembly in a semiconductor device, for example, Japanese Patent Application Laid-Open Publication No. 2003-209132 (Patent Document 1) discloses a structure in which a first plated surface composed of a metal containing nickel as a main component is formed in a half region on a lead-out-part side of a pad part of each lead terminal, and in which a second plated surface made of a metal containing silver as a main component is formed in a half region close to an edge part of a supporting plate of the pad part.

Also, In the lead frame assembly, for example, Japanese Patent Application Laid-Open Publication No. 2007-294530 (Patent Document 2) discloses a structure of a lead frame assembly in which a silver plated surface is formed on a distal-end surface of a pad part of five lead terminals, and in which a thin aluminum wire and a thin gold wire are connected to one of the lead terminals so that the thin aluminum wire is connected to a nickel plated surface and the thin gold wire is connected to the silver plated surface.

Also, in a semiconductor device provided with a semiconductor chip having a power MOSFET or a power bipolar transistor, for example, Japanese Patent Application Laid-Open Publication (Translation of PCT Application) No. 2000-503491 (Patent Document 3) discloses a structure in which the MOSFET or the bipolar transistor has two symmetrically-arranged output terminals on a surface of the semiconductor chip, and in which the output terminals are symmetrically connected to a circuit board via the same two bonding wires.

Also, in a semiconductor device, for example, Japanese Patent Application Laid-Open Publication No. H03-198356 (Patent Document 4) discloses a structure in which at least one of thin metal wires for connecting between a semiconductor element and an internal lead of a lead frame without a semiconductor-element-mounted part is thicker than the other thin metal wires and connects therebetween through the shortest path, and in which the semiconductor element is fixed to the internal lead.

Also, in a semiconductor device, for example, Japanese Utility-Model Application Laid-Open Publication No. H03-109818 (Patent Document 5) discloses a structure which the semiconductor device has a heat dissipating plate, a set of a plurality of leads, and a semiconductor pellet fixed on the heat dissipating plate, in which one lead among the plurality of leads is coupled to the heat dissipating plate, and in which an electrode on the semiconductor pellet and the other lead are electrically connected to each other by a wire.

SUMMARY OF THE INVENTION

In a semiconductor package (semiconductor device) which is assembled by using a lead frame, such a demand that the number of output leads is increased without changing an apparent size of the semiconductor package is required in order to improve functionality.

That is, in accordance with the high functionality of the semiconductor package, it is required to increase only the number of the output leads (output pins) while maintaining the same package size. For example, a power device in which a MOS (Metal Oxide Semiconductor) IC (Integrated Circuit) and a control IC are mounted together in a single package and which has, for example, five output leads, is known.

In such a semiconductor package, for reduction in an ON-resistance, usage of a wire which is thick (has a large diameter) as much as possible is required for the output-side (MOS-side) internal connection wiring in order to reduce a resistance to flow a large current therethrough. However, for the control-side IC, usage of a thin (small-diameter) wire is only required since only such a weak current as a signal flows therethrough.

That is, in the single package, the wires having two types of diameters (hereinafter, referred to as a thin wire, a thick wire, etc.) are used depending on a magnitude of the flowing current.

However, in order to achieve the usage of the thick wire and the thin wire in a single semiconductor package, there are limitations for a plating type and a plating formation method of a 2nd-side (lead-side) wire joint part (hereinafter, referred to as a stitch part) in the wire bonding and for a shape of the stitch part, and therefore, the cost reduction is extremely difficult due to high technical difficulty.

Therefore, in the case of the semiconductor package as described above, generally, an Au wire is used as the thin wire while an Al wire is used as the thick wire so often. In this case, as the plating applied on the stitch part of each lead, Au plating having a thick film thickness (for example, a thickness of about 1 µm) is applied so often so as not to be affected by base Cu or base Ni plating in order to commonly use the plating for both of the wire types.

However, there is a problem that the cost of the semiconductor device is increased by the application of the Au plating having the thick film thickness due to increase in a price of the Au in recent years, which results in further difficulty in the cost reduction of the semiconductor device.

A preferred aim of the embodiment disclosed in the present application is to provide a technique capable of reducing the cost of the semiconductor device.

The other problems and novel characteristics will be apparent from the description of the present specification and the accompanying drawings.

A semiconductor device of an embodiment includes: a die pad; a semiconductor chip mounted on the die pad; a plurality of leads; a first wire for connecting a first electrode pad of the semiconductor chip and a first lead among the plurality of leads to each other; and a second wire having a larger diameter than that of the first wire and connecting a second electrode pad of the semiconductor chip and a second lead among the plurality of leads to each other. Further, in the above-described semiconductor device, a wire joint part of each of the plurality of leads of includes: a first region having the most outer surface on which a first plating is applied; and a second region having the most outer surface on which a second plating different from the first plating is applied, and the second region in the wire joint part is arranged on the die pad side and the first region is arranged at a position distant from the die pad farther than the second region.

According to the embodiment, a cost of a semiconductor device can be reduced.

BRIEF DESCRIPTIONS OF THE DRAWINGS

DESCRIPTIONS OF THE PREFERRED EMBODIMENT

In the following embodiments, the description of the same or similar portions is not repeated in principle unless particularly required.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Still further, in the embodiments described below, when "formed from A", "formed of A", "having A", and "including A" are described regarding the components or others, it goes without saying that other elements are not excluded except the case where the component is particularly described as the element. Similarly, in the embodiments described below, when the shape of the components, positional relation thereof, and the like are mentioned, the substantially approximate or similar shapes and the like as the shape are included therein unless otherwise stated or except the case where it is conceivable that they are apparently excluded in principle. The same goes for the numerical value and the range described above.

Hereinafter, embodiments will be described in detail based on the accompanying drawings. Note that components having the same function are denoted by the same reference symbols throughout all the drawings for describing the embodiments, and the repetitive description thereof is omitted. Also, hatching is added even in a plan view so as to make the drawings easy to see.

Embodiment

Figure 1:
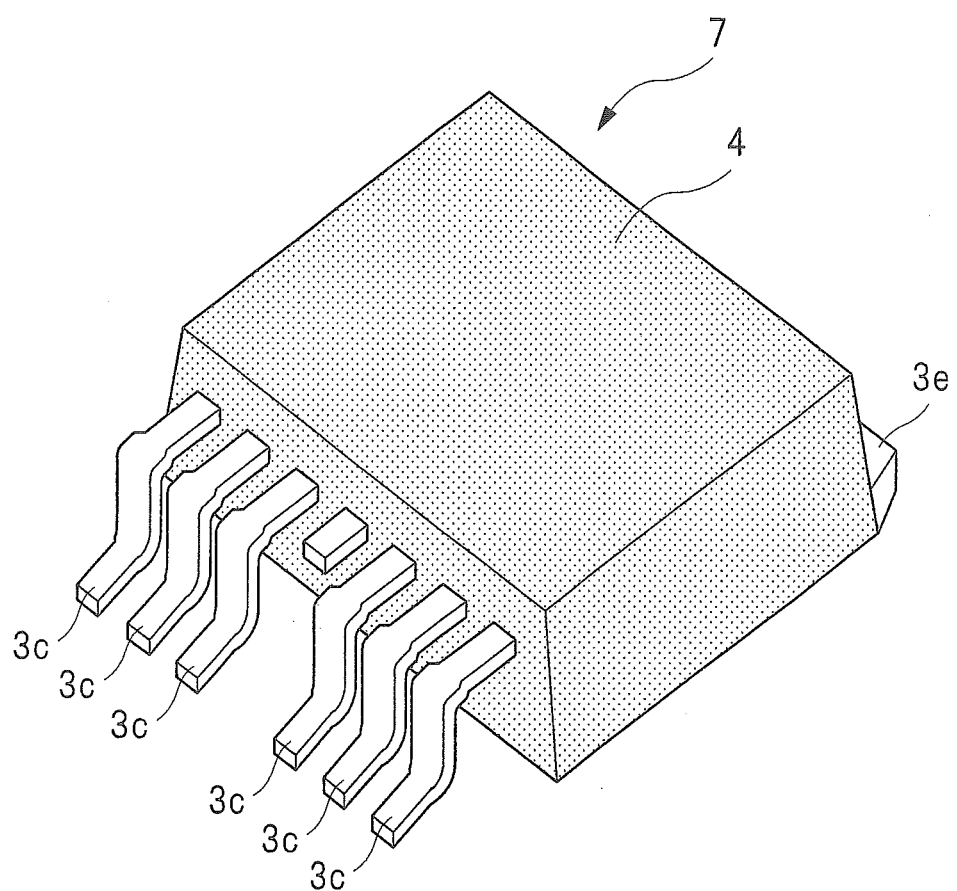
FIG. 1 is a perspective view illustrating an example of a structure of a semiconductor device of an embodiment.
Figure 2:
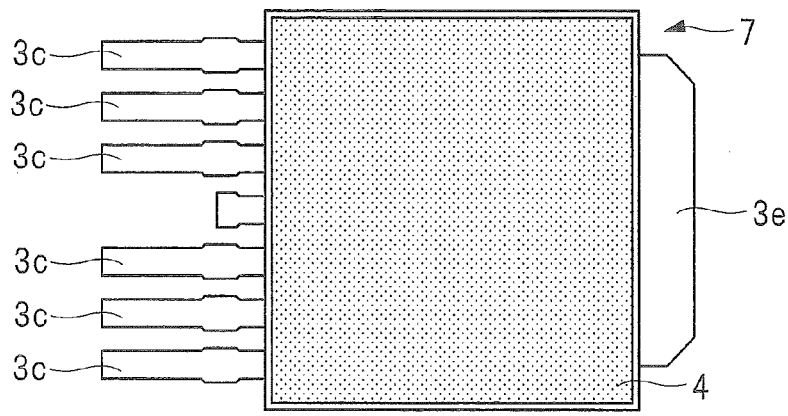
FIG. 2 is a plan view illustrating an example of a structure on a front-surface side of the semiconductor device of FIG. 1.
Figure 3:
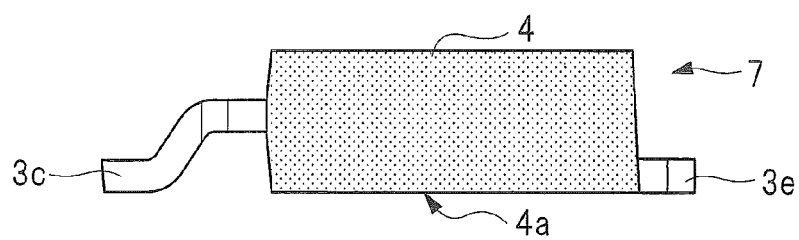
FIG. 3 is a side view illustrating an example of a structure on a side-surface side of the semiconductor device of FIG. 1.
Figure 4:
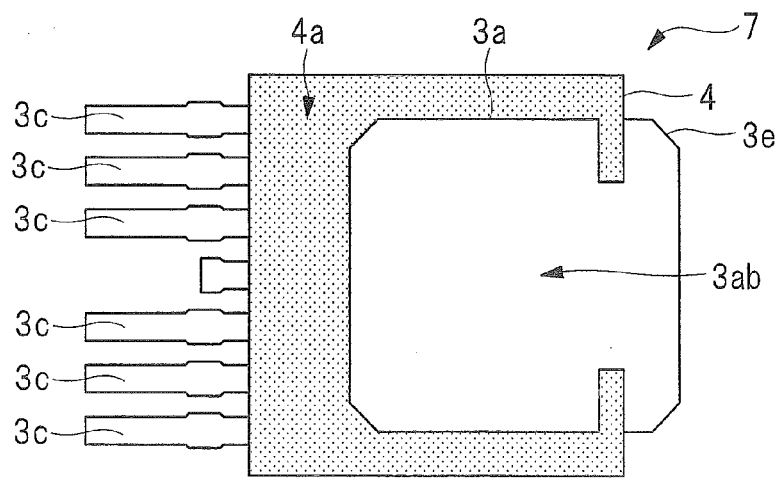
FIG. 4 is a back view illustrating an example of a structure on a back-surface side of the semiconductor device of FIG. 1.
Figure 5:
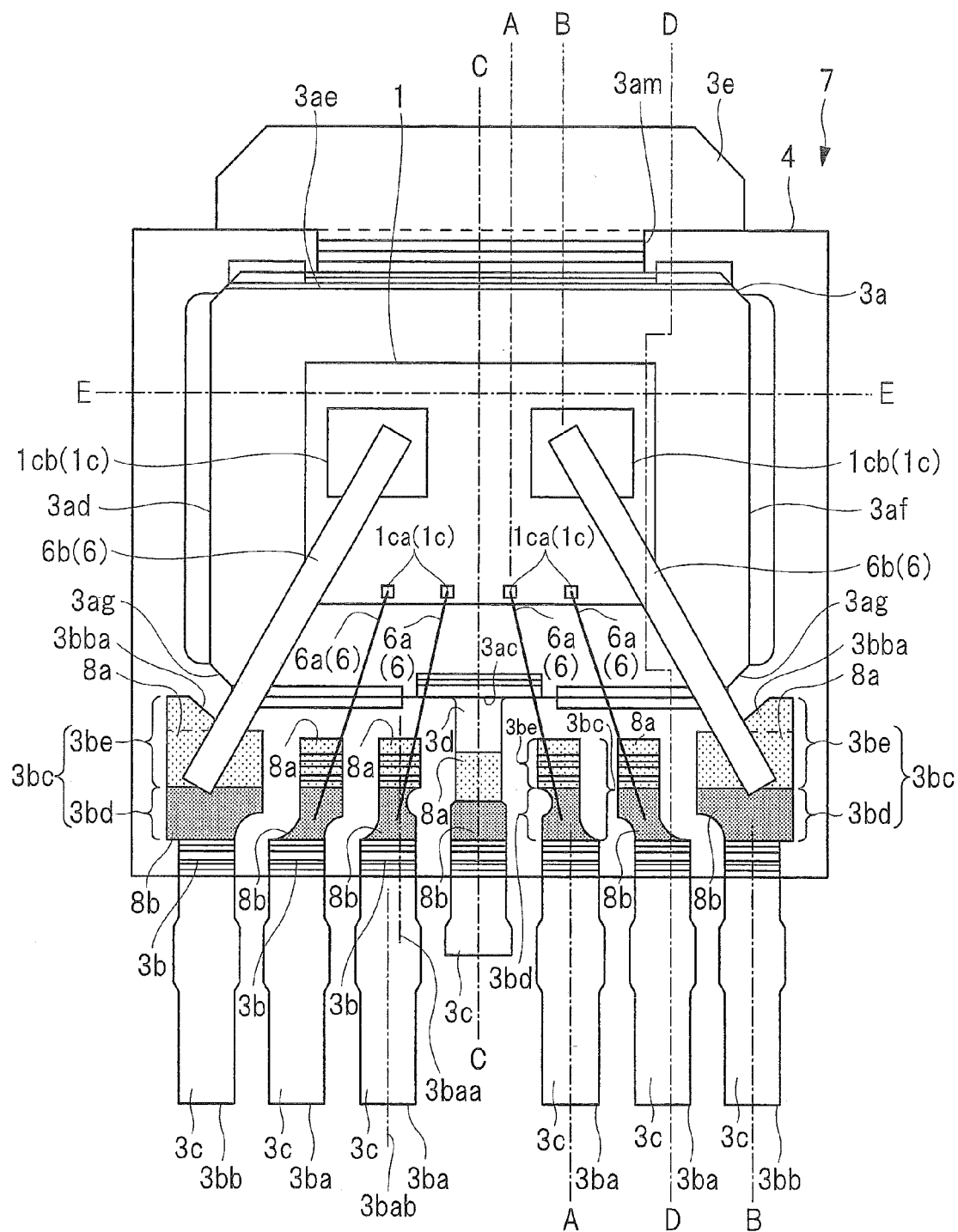
FIG. 5 is a plan view illustrating an example of the structure of the semiconductor device of FIG. 1 so that a sealer is transparent.
Figure 6:
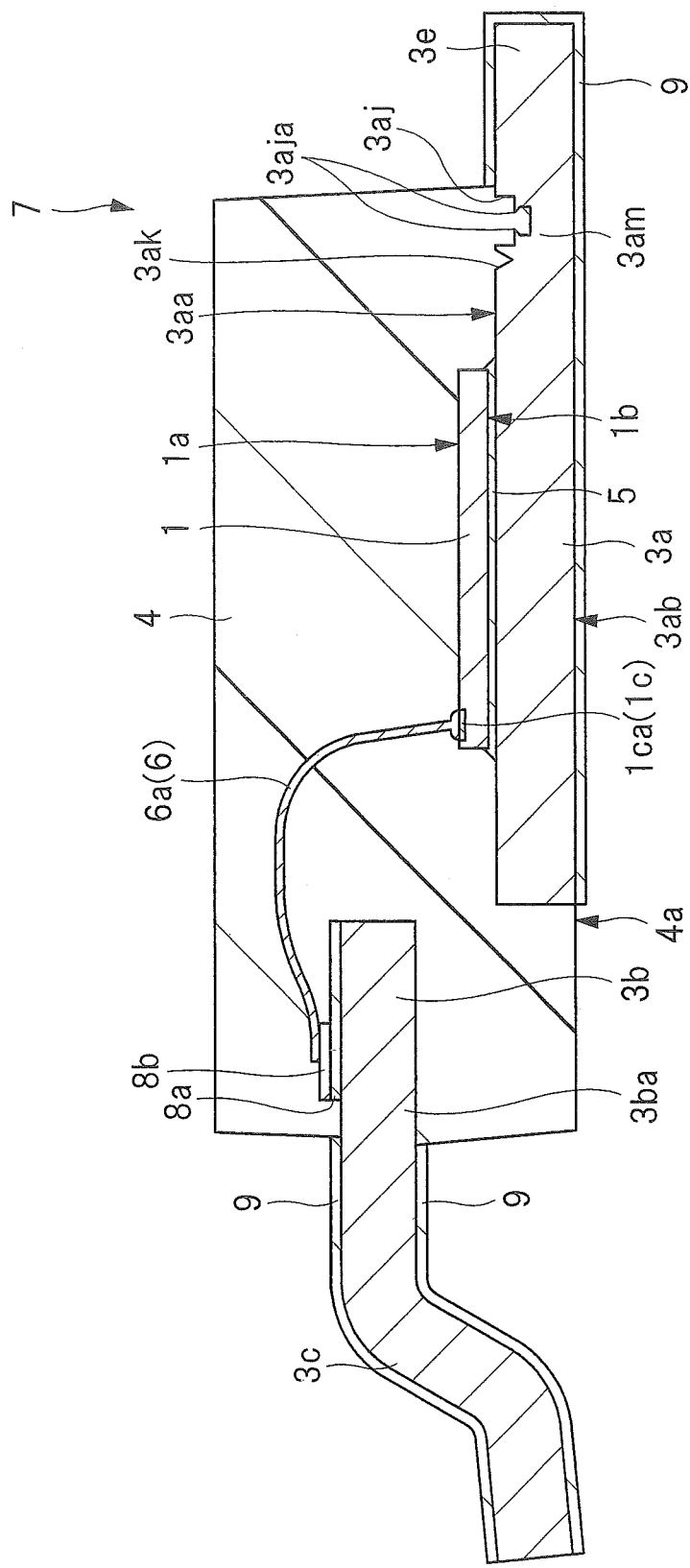
FIG. 6 is a cross-sectional view illustrating an example of a structure cut taken along a line A-A of FIG. 1.
Figure 7:
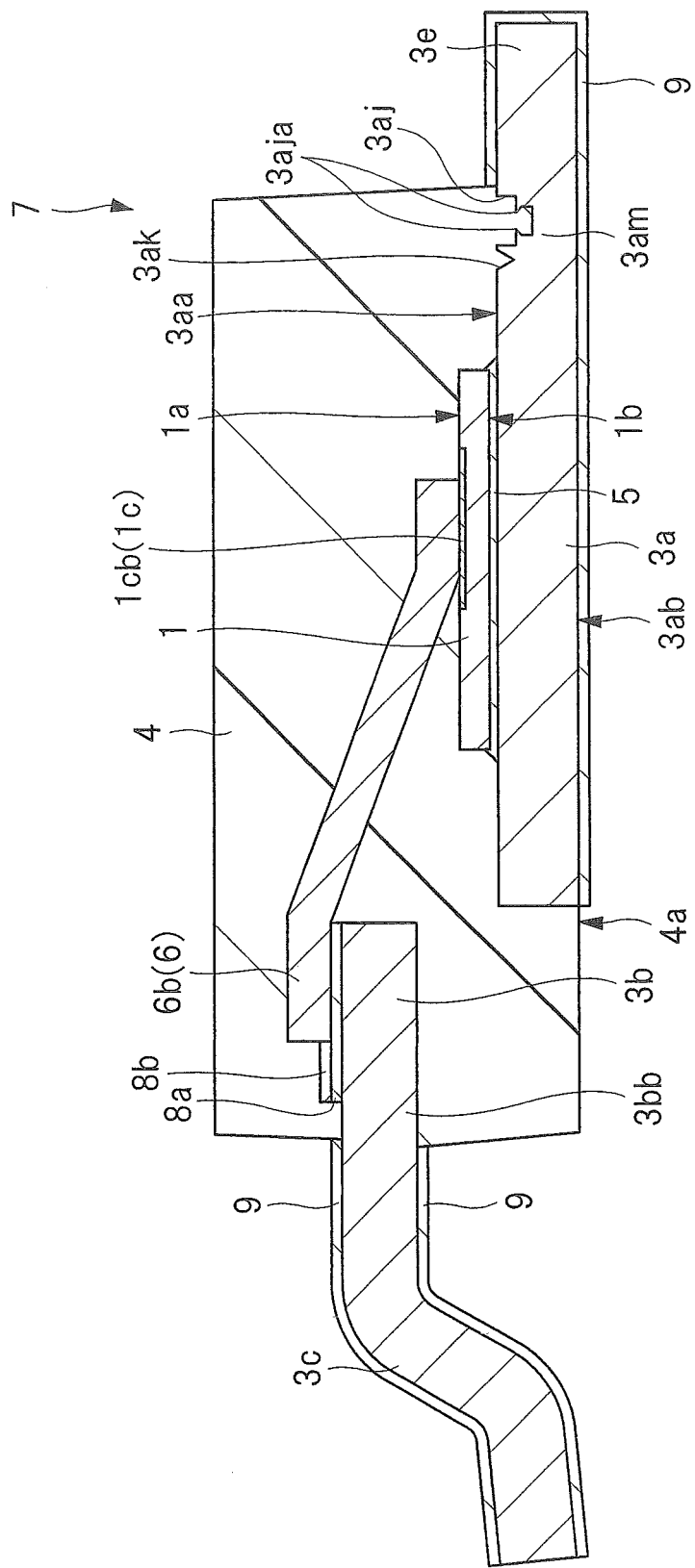
FIG. 7 is a cross-sectional view illustrating an example of a structure cut taken along a line B-B of FIG. 1.
Figure 8:
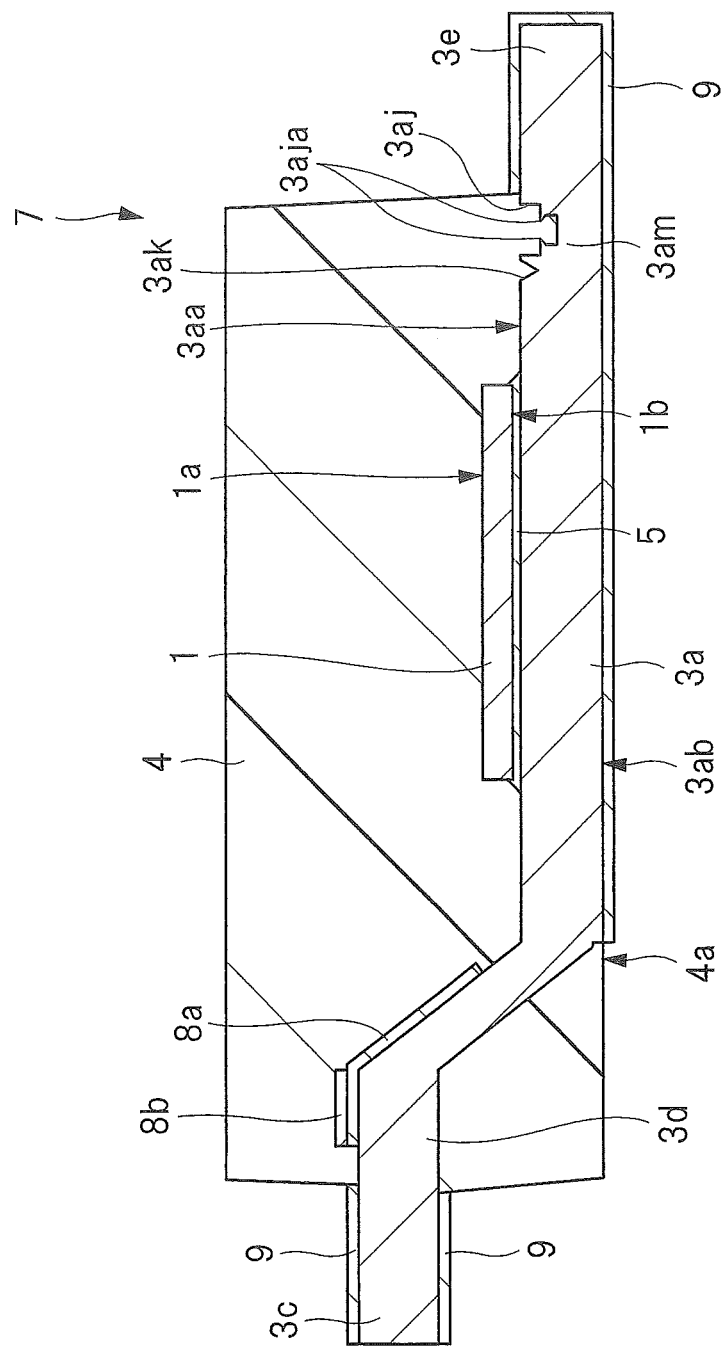
FIG. 8 is a cross-sectional view illustrating an example of a structure cut taken along a line C-C of FIG. 1.
Figure 9:
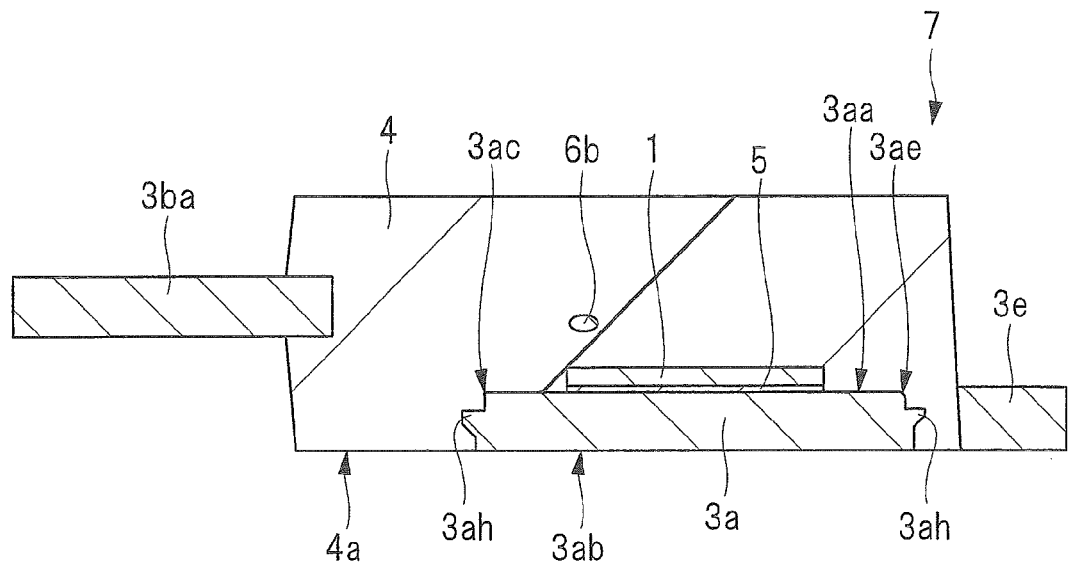
FIG. 9 is a cross-sectional view illustrating an example of a structure cut taken along a line D-D of FIG. 1.
Figure 10:
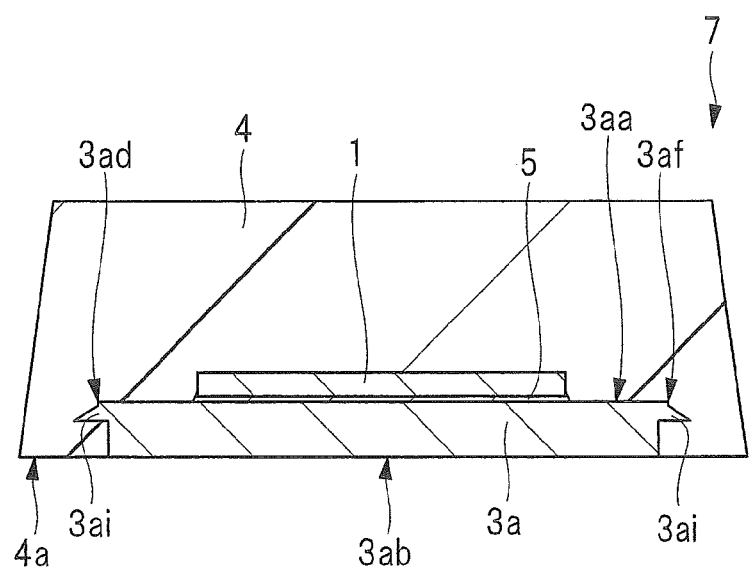
FIG. 10 is a cross-sectional view illustrating an example of a structure cut taken along a line E-E of FIG. 1.
Figure 11:
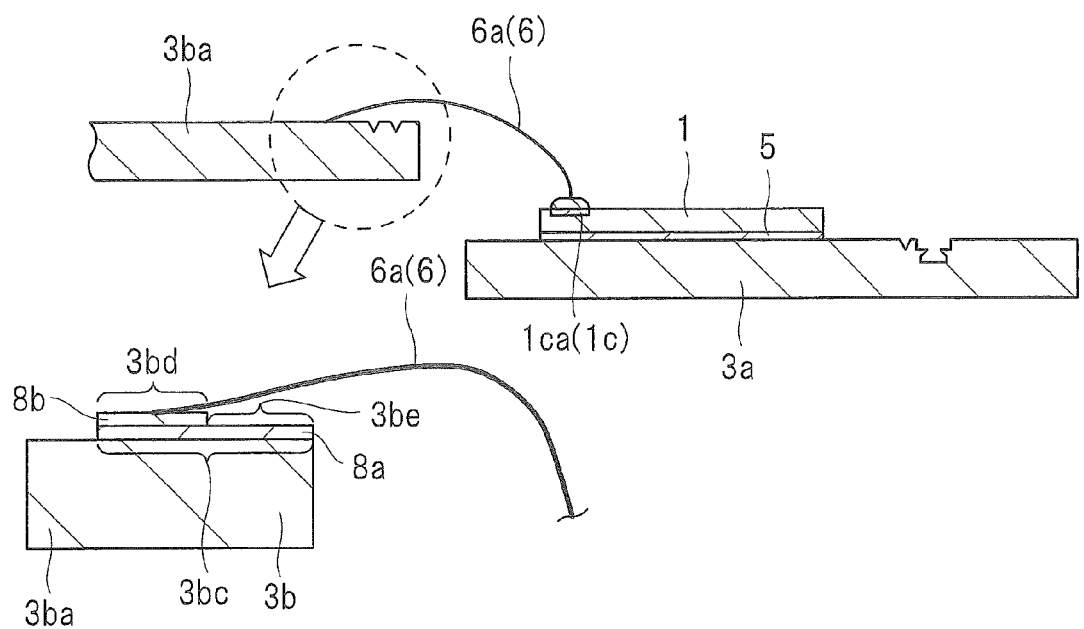
FIG. 11 is a partial cross-sectional view and an enlarged partial cross-sectional view illustrating an example of a lead cross-sectional structure and a plating structure on the line A-A of FIG. 1.
Figure 12:
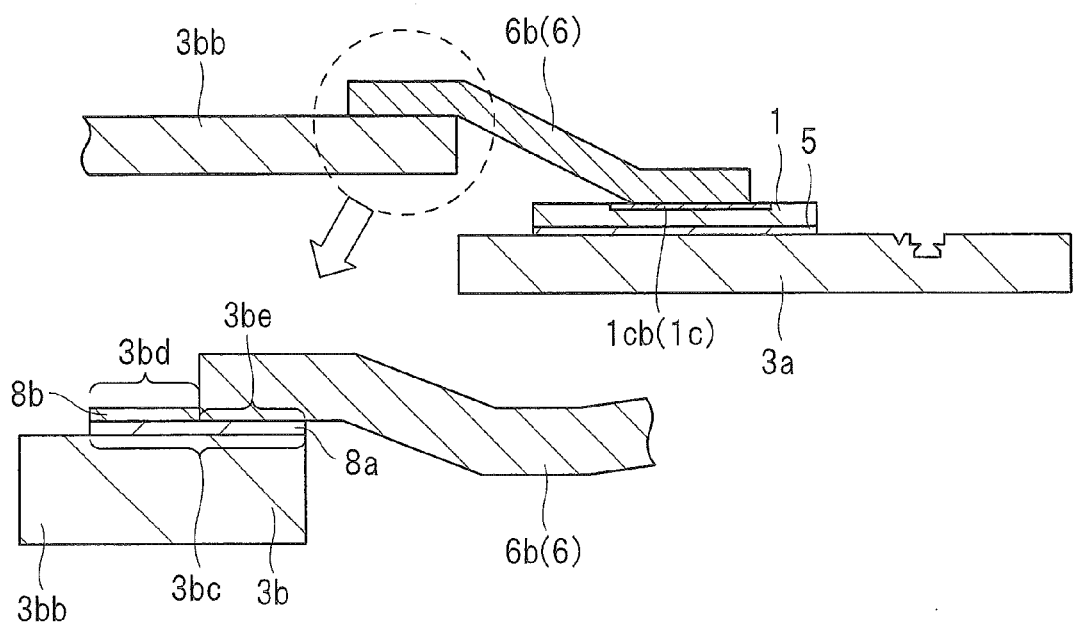
FIG. 12 is a partial cross-sectional view and an enlarged partial cross-sectional view illustrating an example of a lead cross-sectional structure and a plating structure on the line B-B of FIG. 1.

FIG. 1 is a perspective view illustrating an example of a structure of a semiconductor device of an embodiment, FIG. 2 is a plan view illustrating an example of a structure on a front-surface side of the semiconductor device of FIG. 1, FIG. 3 is a side view illustrating an example of a structure on a side-surface side of the semiconductor device of FIG. 1, FIG. 4 is a back view illustrating an example of a structure on a back-surface side of the semiconductor device of FIG. 1, and FIG. 5 is a plan view illustrating an example of the structure of the semiconductor device of FIG. 1 so that a sealer is transparent. Also, FIG. 6 is a cross-sectional view illustrating an example of a structure cut taken along a line A-A of FIG. 1, FIG. 7 is a cross-sectional view illustrating an example of a structure cut taken along a line B-B of FIG. 1, FIG. 8 is a cross-sectional view illustrating an example of a structure cut taken along a line C-C of FIG. 1, and FIG. 9 is a cross-sectional view illustrating an example of a structure cut taken along a line D-D of FIG. 1. Further, FIG. 10 is a cross-sectional view illustrating an example of a structure cut taken along a line E-E of FIG. 1, FIG. 11 is a partial cross-sectional view and an enlarged partial cross-sectional view illustrating an example of a lead cross-sectional structure and a plating structure on the line A-A of FIG. 1, and FIG. 12 is a partial cross-sectional view and an enlarged partial cross-sectional view illustrating an example of a lead cross-sectional structure and a plating structure on the line B-B of FIG. 1.

The semiconductor device of the present embodiment illustrated in FIGS. 1 to 5 is a resin-seal-type semiconductor package (hereinafter, simply referred to as a package) 7 which is assembled by using a lead frame, and employs wires (thin wires) having two types of small and large thicknesses (diameters) are used for electrical connection between a semiconductor chip and a lead.

In the present embodiment, an IPD (intelligent power device) provided with seven output pins (output leads) is cited and explained as an example of the above-described package 7. The IPD is the package 7 for a power device mainly used for installation on a vehicle or others. Also in the package 7, a wire which is thick (has a large diameter) as much as possible is used for the output-side (MOS-side) internal connection wiring in order to reduce a resistance so that a large current flows for reducing the ON-resistance whereas a thin (small-diameter) wire is used for the control-circuit side since only such a weak current as a signal flows therethrough.

That is, the package 7 of the present embodiment uses a thin (small-diameter) first wire which is used for the signal for the control circuit or others and a thick (large-diameter) second wire which is connected to the output-side (MOS-side) internal connection wiring and through which the large current flows.

A structure of the package 7 illustrated in FIGS. 1 to 5 will be explained as follows. The structure has: a semiconductor chip on which semiconductor elements (semiconductor integrated circuits such as a MOS and a control circuit for the MOS) are formed; a die pad 3a on which the semiconductor chip 1 is mounted; a plurality of (here, seven) leads which are arranged so as to be aligned on a side of the die pad 3a; and a plurality of wires 6 which electrically connect between an electrode pad 1c of the semiconductor chip 1 and the plurality of leads.

As illustrated in FIG. 5, note that a plurality of electrode pads 1c are provided on a surface 1a (see FIGS. 6 and 7) of the semiconductor chip 1, and the plurality of electrode pads 1c include a plurality of first electrode pads 1ca and a plurality of second electrode pads 1cb.

Also, each of the plurality of leads includes an inner lead 3b and an outer lead 3c which is integrally formed with the inner lead 3b and which serves as an output pin (external terminal), and the plurality of inner leads 3b further include a first lead 3ba and a second lead 3bb.

Further, the plurality of wires 6 include an Au wire 6a serving as the small-diameter (thin) first wire and an Al wire 6b serving as the second wire having a larger diameter (thicker) than that of the Au wire 6a. Here, the Au wire 6a is a wire containing Au as a main component. While an Au—Pd wire is cited as an example, a Cu wire or others may be used. A diameter of the Au wire 6a is, for example, about 23 µm. On the other hand, a diameter of the Al wire 6b is, for example, about 300 µm.

Note that the semiconductor chip 1, the plurality of first leads 3ba and second leads 3bb, the plurality of Au wires 6a and Al wires 6b, and the die pad 3a are partially sealed by a sealer 4 made of a sealing resin.

Also, as illustrated in FIGS. 6 and 7, the die pad 3a has an upper surface 3aa and a lower surface 3ab opposite thereto, and the semiconductor chip 1 is mounted on the upper surface 3aa of the die pad 3a via a die-bonding material 5. The die-bonding material 5 is, for example, solder.

Further, the upper surface 3aa of the die pad 3a has a substantially quadrangular shape as illustrated in FIG. 5 which has a first side 3ac opposed to a lead row of the plurality of inner leads 3b, a second side 3ad and a fourth side 3af intersecting with the first side 3ac and opposed to each other, and a third side 3ae opposed to the first side 3ac.

Note that the die pad 3a is integrally formed with a suspending lead 3d on the first side 3ac thereof, and is therefore supported by the suspending lead 3d. The suspending lead 3d is arranged at the center of the lead row of the plurality of inner leads 3b.

Also, the die pad 3a is integrally formed with a heat dissipating plate 3e on the third side 3ae thereof, and the heat dissipating plate 3e is exposed from the sealer 4 as illustrated in FIGS. 2 to 5. Further, as illustrated in FIG. 4, the lower surface 3ab of the die pad 3a is also exposed from a back surface 4a of the sealer 4.

In this manner, the heat dissipating plate 3e exposed from the sealer 4 is provided, and besides, the lower surface 3ab of the die pad 3a is also exposed from the back surface 4a of the sealer 4, and therefore, the heat emitted from the semiconductor chip 1 can be discharged from the heat dissipating plate 3e and the lower surface 3ab of the die pad 3a, and heat dissipating performance of the package 7 can be enhanced.

Also, the semiconductor chip 1 has a front surface (main surface) 1a and a back surface 1b opposite thereto, and the plurality of electrode pads 1c are formed on the surface 1a as illustrated in FIG. 5. Therefore, as illustrated in FIG. 6, the semiconductor chip 1 is mounted on the die pad 3a via the die-bonding material 5 so that the back surface 1b thereof is opposed to the upper surface 3aa of the die pad 3a.

Note that a large area is ensured for the second electrode pads 1cb illustrated in FIG. 5 of the plurality of electrode pads 1c formed on the surface 1a of the semiconductor chip 1 because the large current flows therethrough whereas each of the plurality of first electrode pads 1ca thereof is a pad having an area much smaller than that of the second electrode pad 1cb.

Therefore, the first electrode pad 1ca of the plurality of electrode pads 1c of the semiconductor chip 1 and the first lead 3ba of the plurality of inner leads 3b are electrically connected to each other via the thin Au wire 6a.

On the other hand, the second electrode pad 1cb of the plurality of electrode pads is of the semiconductor chip 1 and the second lead 3bb of the plurality of inner leads 3b are electrically connected to each other via the thick Al wire 6b.

Also, the plurality of outer leads 3c connected to the respective first lead 3ba and second lead 3bb except for the outer lead 3c connected to the suspending lead 3d are formed so as to be bent in a gull-wing shape as illustrated in FIGS. 1 and 3, and besides, exterior plating 9 is applied onto surfaces (except for cut surfaces at distal ends) of all the outer leads 3c as illustrated in FIGS. 6 to 8. The exterior plating 9 is, for example, 100% tin (Sn) plating, and the similar exterior plating 9 is applied onto the parts of the lower surface 3ab and the surface of the heat dissipating plate 3e of the die pad 3a or others which are exposed from the sealer 4.

Note that each of the die pad 3a, the leads (the inner lead 3b and the outer lead 3c), the suspending lead 3d, and the heat dissipating plate 3e is made of, for example, a plate material of a copper (Cu) alloy or an iron (Fe)-based alloy.

Also, the sealer 4 is made of, for example, an epoxy-based thermosetting resin or others.

In the package 7 of the present embodiment, each of the plurality of inner leads 3b has a stitch part 3bc serving as a wire joint part at a distal end on the die-pad 3a side as illustrated in FIG. 5, and besides, each of the stitch parts 3bc has a first region 3bd having the most outer surface on which the first plating is applied and a second region 3be having the most outer surface on which the second plating different from the first plating is applied.

Further, the second region 3be in the stitch part 3bc is arranged in the die pad 3a side. On the other hand, the first region 3bd is arranged at a position distant from the die pad 3a farther than the second region 3be.

That is, in each stitch part 3bc, the second region 3be obtained by applying the second plating on the most outer surface thereof is formed on the die pad 3a side, and the first region 3bd obtained by applying the first plating on the most outer surface thereof is formed on a periphery side of the sealer 4.

Moreover, the Au wire 6a is electrically connected to the first region 3bd of the stitch part 3bc whereas the Al wire 6b is electrically connected to the second region 3be.

Accordingly, as illustrated in FIG. 11, Ag plating 8b is applied onto the most outer surface of the first region 3bd as the first plating so that the connection with the Au wire 6a is favorable. On the other hand, as illustrated in FIG. 12, Ni plating 8a is applied onto the most outer surface of the second region 3be on the die pad 3a side as the second plating so that the connection with the Al wire 6b is favorable.

Note that, in each inner lead 3b as illustrated in each enlarged cross-sectional views of FIGS. 11 and 12, the Ag plating (first plating) 8b and the Ni plating (second plating) 8a are stacked in the first region 3bd of the stitch part 3bc so that the Ni plating 8a is arranged in a lower layer of the Ag plating 8b. Further, the Ni plating 8a is arranged over both of the first region 3bd and the second region 3be, and only the Ni plating 8a is formed in the second region 3be on the die pad 3a side.

That is, in the stitch part 3bc of each inner lead 3b, the first region 3bd has a double-layer plating structure formed of the Ni plating 8a in the lower layer and the Ag plating 8b in the upper layer whereas the second region 3be has a single-layer plating structure formed of only the Ni plating 8a, so that the Ni plating 8a is formed in the first region 3bd and the second region 3be.

However, the first region 3bd is not always required to have the double-layer structure, but may have the single-layer plating structure as long as the Ag plating 8b is formed on the most outer surface thereof.

In this manner, in each stitch part 3bc, the Ni plating 8a can be arranged on the most outer surface of the region on the die pad 3a side (the second region 3be), and the Ag plating 8b can be arranged on the most outer surface of the region on the periphery side of the sealer 4 (the first region 3bd).

The Ag plating 8b and the Ni plating 8a are formed on a below-described lead frame 3 illustrated in FIG. 15 by a stripe plating method before the die pad 3a and the plurality of leads (the inner lead 3b and the outer lead 3c) are formed by stamping at a stage of the lead-frame formation. The employment of the stripe plating method can support the Al wire 6b and the Au wire 6a at a low cost.

As a result, as illustrated in FIGS. 7 and 12, the Ni plating 8a is arranged on the distal end side of the stitch part 3bc of the second lead 3bb to which the thick Al wire 6b is connected. Therefore, a connection available area in wedge bonding can be ensured, so that connection reliability of the wire bonding with the Al wire 6b which is the thick wire can be enhanced and ensured.

Note that ball bonding is employed for the thin wire 6a. Therefore, the wire bonding can be performed even in the region of the AG plating 8b (the first region 3bd) of the stitch part 3bc arranged on the periphery side of the sealer 4 while forming a wire loop toward above the lead as illustrated in FIGS. 6 and 11, and therefore, the wire loop can be formed without contacting the Ni plating 8a on the distal end side.

In this manner, in each stitch part 3bc, the Ni plating 8a which is optimum for the Al wire 6b can be applied onto the second region 3be, and the Ag plating 8b which is optimum for the Au wire 6a can be applied onto the first region 3bd, and therefore, the connection reliability of each wire 6 can be enhanced.

Also, as illustrated in FIG. 5, in each stitch part 3bc of the plurality of inner leads 3b, a planar-view area of the second region 3be is larger than a planar-view area of the first region 3bd.

Therefore, in each stitch part 3bc to which 2nd bonding is performed, the region of the Ni plating 8a positioned on the die pad side can be formed wider in the planar-view area than the region of the Ag plating 8b positioned on the periphery side of the sealer 4.

As a result, the connection available area in the wedge bonding on the 2nd side of the thick Al wire 6b can be sufficiently ensured, and therefore, connectivity in the wedge bonding can be more enhanced.

Next, other characteristic parts of the structure of the package 7 of the present embodiment will be explained.

As illustrated in FIG. 5, the second region 3be on the die pad 3a side in the stitch part 3bc of the second lead 3bb has an extending part 3bba extending in a direction of being closer to the die pad 3a than the second region 3be of the stitch part 3bc of the first lead 3ba.

As described above, by providing the extending part 3bba in the second region 3be of the stitch part 3bc of the second lead 3bb, the extending part can be used as a clamp area when the second lead 3bb is pressed by a below-described clamper 12 of FIG. 17 in the wedge bonding of the Al wire 6b, so that the clamp area in the wire bonding (wedge bonding) can be sufficiently ensured.

Also, the die pad 3a has a cut-away part 3ag at a position oppose to the extending part 3bba of the second lead 3bb. This cut-away part 3ag is formed by obliquely cutting a corner part of the upper surface 3aa of the die pad 3a in a planar view in accordance with the shape of the extending part 3bba of the second lead 3bb arranged oppose thereto.

Note that the cut-away part 3ag of the die pad 3a is obtained in the upper surface 3aa of the die pad 3a by cutting away the die pad 3a by an amount not affecting the chip mounting capability. Here, the amount not affecting the chip mounting capability of the die pad 3a means an amount by which the semiconductor chip 1 is not protruded from the die pad 3a in the planar view.

As described above, by forming the cut-away part 3ag at the corner of the die pad 3a in accordance with the shape of the extending part 3bba of the second lead 3bb, the contact between the second lead 3bb and the die pad 3a can be avoided.

Also, as illustrated in FIG. 5, in the package 7 of the present embodiment, the lead row formed of the plurality of inner leads 3b and the first side 3ac of the die pad 3a are arranged to be opposite to each other. That is, all of the seven inner leads 3b are opposed to the first side 3ac which is one side of the die pad 3a, and are aligned in one row. Here, the seven inner leads 3b are arranged so that each interval between the leads adjacent to each other is reduced as much as possible, and, as a result, the structure capable of achieving the high functionality is obtained by increasing the number of the output leads without increasing a package size.

In the package 7, the suspending lead 3d for supporting the die pad 3a is arranged at the center of the lead row formed of the plurality of inner leads 3b. Further, in the first region 3bd of the stitch part 3bc of the first lead 3ba, a center line 3baa of the first region 3bd in a width direction is positioned closer to the suspending lead 3d side than a center line 3bab of the first lead 3ba in the width direction.

That is, the first lead 3ba has a shape that is bent from the periphery side of the sealer 4 toward the suspending lead 3d side in the planar view more as the first lead gets closer to the die pad 3a side. As a result, the center line 3baa of the first region 3bd of the first lead 3ba is positioned closer to the suspending lead 3d side than the center line 3bab of the first lead 3ba in the width direction in the planar view. That is, on both sides of the suspending lead 3d, the first lead 3ba is arranged so that each first region 3bd is closer to the die pad 3a side.

In this manner, the area of the second region 3be of the stitch part 3bc to which the thick Al wire 6b is connected can be largely formed in the width direction of the lead. Particularly, in the lead row formed of the seven inner leads 3b, the two second leads 3bb are arranged at both ends of the above-described lead row, respectively.

In this manner, the adjacent lead is not arranged on each one side of the both ends of the above-described lead row, and therefore, the stitch part 3bc can be largely formed with respect to the width direction of the lead.

As a result, in the second region 3be of the stitch part 3bc, the connection reliability between the thick Al wire 6b and the second region 3be of the stitch part 3bc can be enhanced.

Also, in the package 7 of the present embodiment, as illustrated in FIG. 9, a protruding part 3ah is provided on a side surface of the die pad 3a on the first-side 3ac side and a side surface thereof on the third-side 3ae side. Further, as illustrated in FIG. 10, a protruding part 3ai is provided on a side surface of the die pad 3a on the second-side 3ad side and a side surface thereof on the fourth-side 3af side.

As described above, by providing the protruding parts 3ah and 3ai on the respective surfaces of the die pad 3a, wedging with the sealing resin (the sealer 4) can be improved, so that fall-off of the die pad 3a from the sealer 4 can be suppressed or prevented.

Also, a joint part 3am with the heat dissipating plate 3e connected to the side surface of the die pad 3a on the third-side 3ae side illustrated in FIG. 5 is provided with a concave part 3aj and a V groove 3ak as illustrated in FIGS. 6 and 7. Further, inside the concave part 3aj, a protruding part 3aja is formed.

As described above, by providing the concave part 3aj and the V groove 3ak in the joint part 3am which connects between the die pad 3a and the heat dissipating plate 3e, the wedging with the sealing resin (the sealer 4) can be improved, so that movement of the die pad 3a and the heat dissipating plate 3e in the lead extending direction can be suppressed or prevented. Further, by forming the protruding part 3aja inside the concave part 3aj, detachment or fall-off of the heat dissipating plate 3e from the sealer 4 can be suppressed or prevented.

Next, assembly of the semiconductor device (the package 7) of the present embodiment will be explained along with an assembly flowchart illustrated in FIG. 13.

Figure 13:
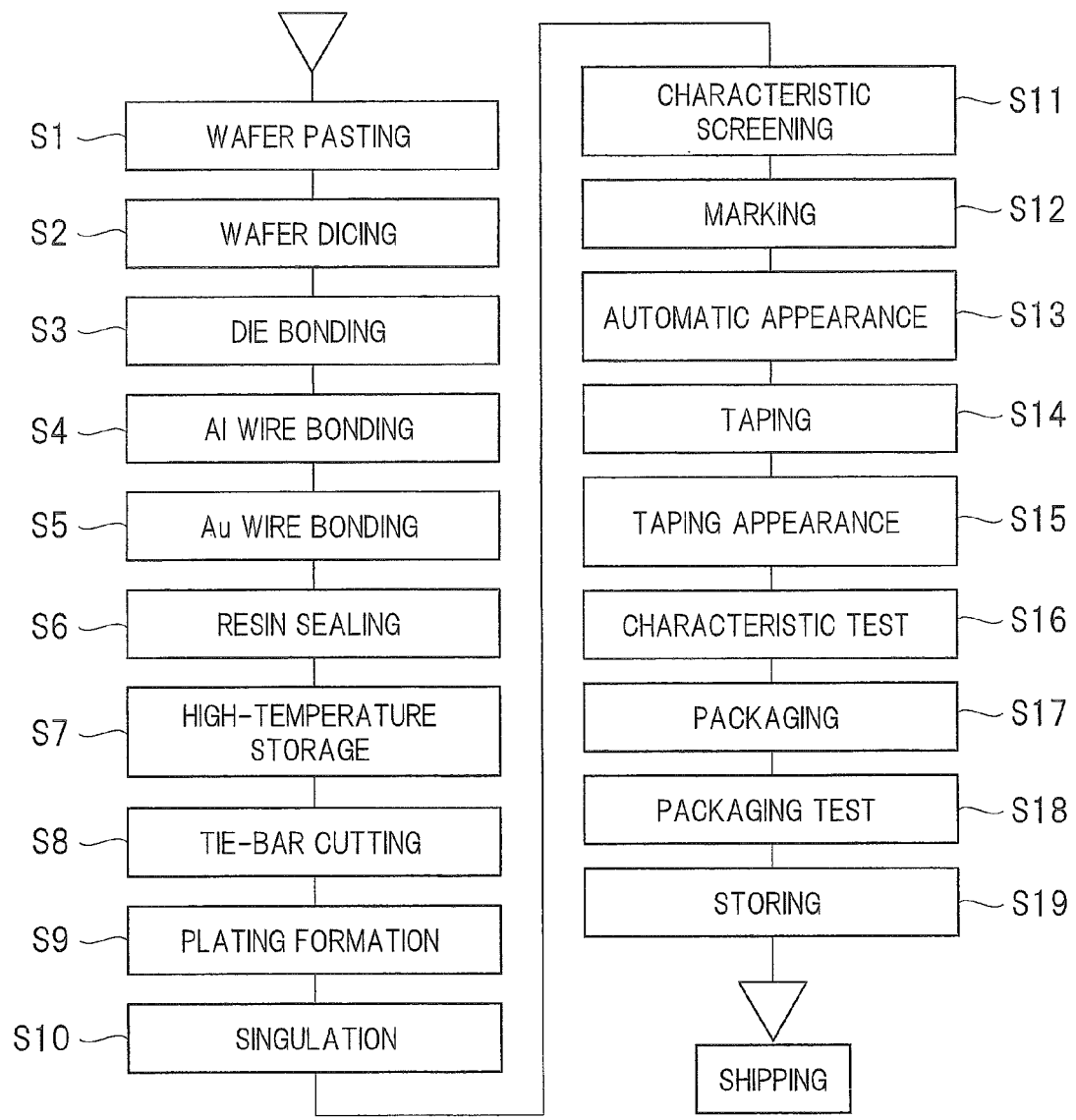
FIG. 13 is a flowchart illustrating an example of an assembly procedure of the semiconductor device of FIG. 1.
Figure 14:
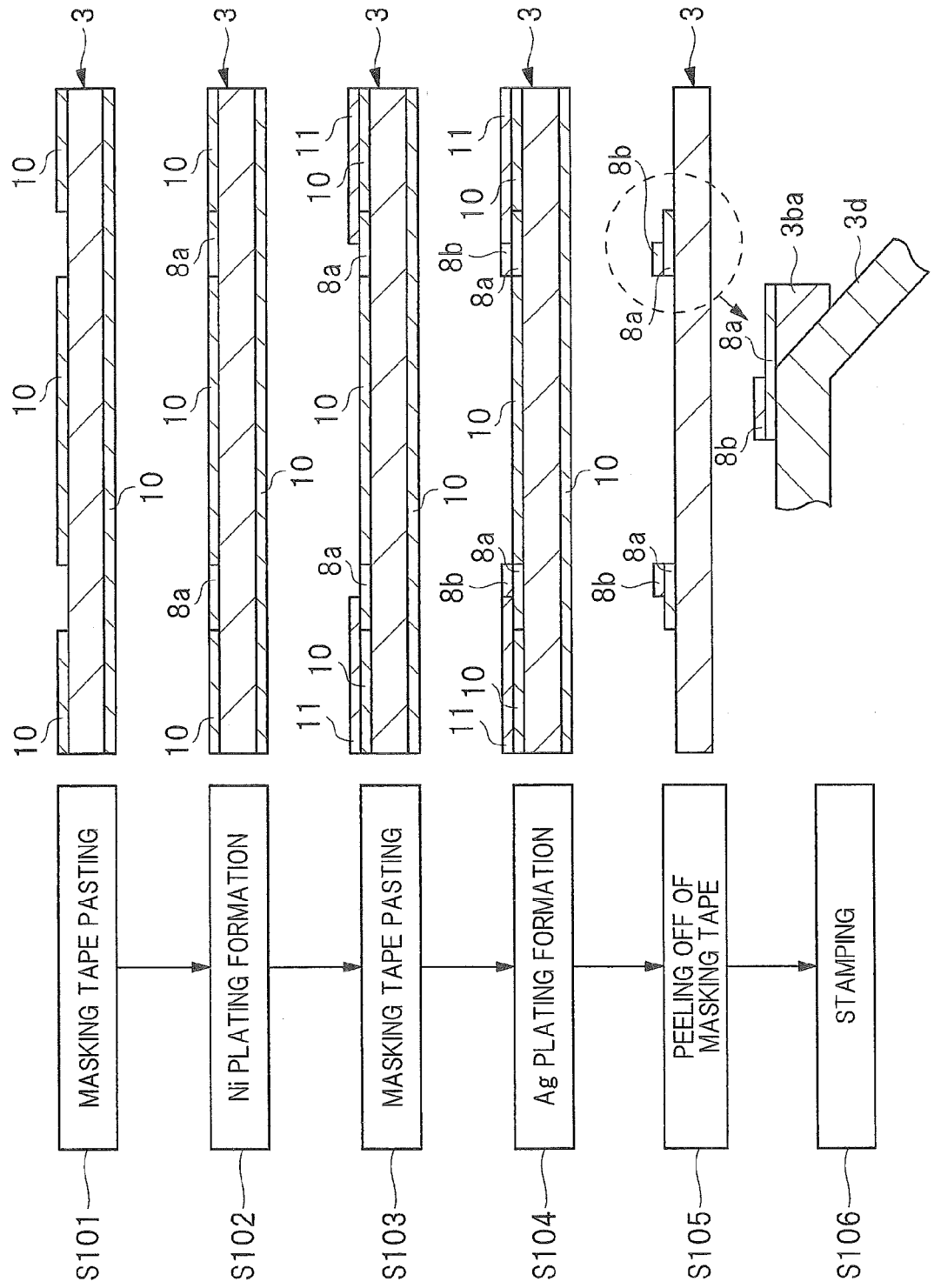
FIG. 14 is a process flowchart illustrating an example of a plating formation method of a lead frame used in the assembly of FIG. 13.

FIG. 13 is a flowchart illustrating an example of an assembly procedure of the semiconductor device of FIG. 1, and FIG. 14 is a process flowchart illustrating an example of the plating formation method of the lead frame used in the assembly of FIG. 13. Further, FIG. 15 is a partial plan view illustrating an example of the structure of the lead frame used in the assembly of FIG. 13, FIG. 16 is an enlarged partial plan view illustrating an example of the clamp area in a wire bonding step of the thick wire in the assembly of the semiconductor device of FIG. 1, and FIG. 17 is an enlarged partial plan view illustrating an example of a state of the wire bonding of the thick wire while pressing the clamp area of FIG. 16.

First, a method of forming the Ni plating 8a and the Ag plating 8b onto the lead frame 3 of the present embodiment will be explained by using FIG. 14.

On the lead frame 3 used in the assembly of the semiconductor device (the package 7) of the present embodiment, the Ni plating 8a and the Ag plating 8b are formed at desired portions by the stripe plating method prior to the formation of the die pad 3a and the plurality of leads (the inner lead 3b and the outer lead 3c) by the stamping.

The stripe plating method is a method of forming partial plating in a band shape having a predetermined width in a length direction of a lead material on a surface of the lead material (the lead frame 3).

First, a masking tape illustrated in a step S101 of FIG. 14 is pasted. The lead frame 3 is wound in a coil form here, and the plating is formed for the lead frame 3 wound in the coil form. At this time, a masking tape 10 is pasted on a portion on which the plating is not to be applied. That is, the masking tape 10 is pasted on the lead frame 3 so that a portion on which the plating is to be applied is opened.

Then, the Ni plating illustrated in a step S102 is formed. Here, the Ni plating 8a is formed in an opening portion onto which the masking tape 10 is not pasted.

Then, pasting of the masking tape illustrated in a step S103 is performed. Here, a masking tape 11 is pasted on a part of the Ni plating 8a and on the masking tape 10 so that only the portion on which the Ag plating 8b is to be formed on the Ni plating 8a is opened.

Then, formation of the Ag plating illustrated in a step S104 is performed. Here, the Ag plating 8b is formed in the opening portion on the Ni plating 8a on which the masking tape 10 and the masking tape 11 are not pasted.

In this manner, a state in which the Ag plating 8b is formed on the part of the Ni plating 8a is obtained.

Then, peeling off of the masking-tapes illustrated in a step S105 is performed. Here, all of the masking tape 10 and the masking tape 11 are peeled off from the lead frame 3. In this manner, the Ni plating 8a and the Ag plating 8b on an upper layer of the part thereof are formed at the desired portion on the lead frame 3.

Figure 15:
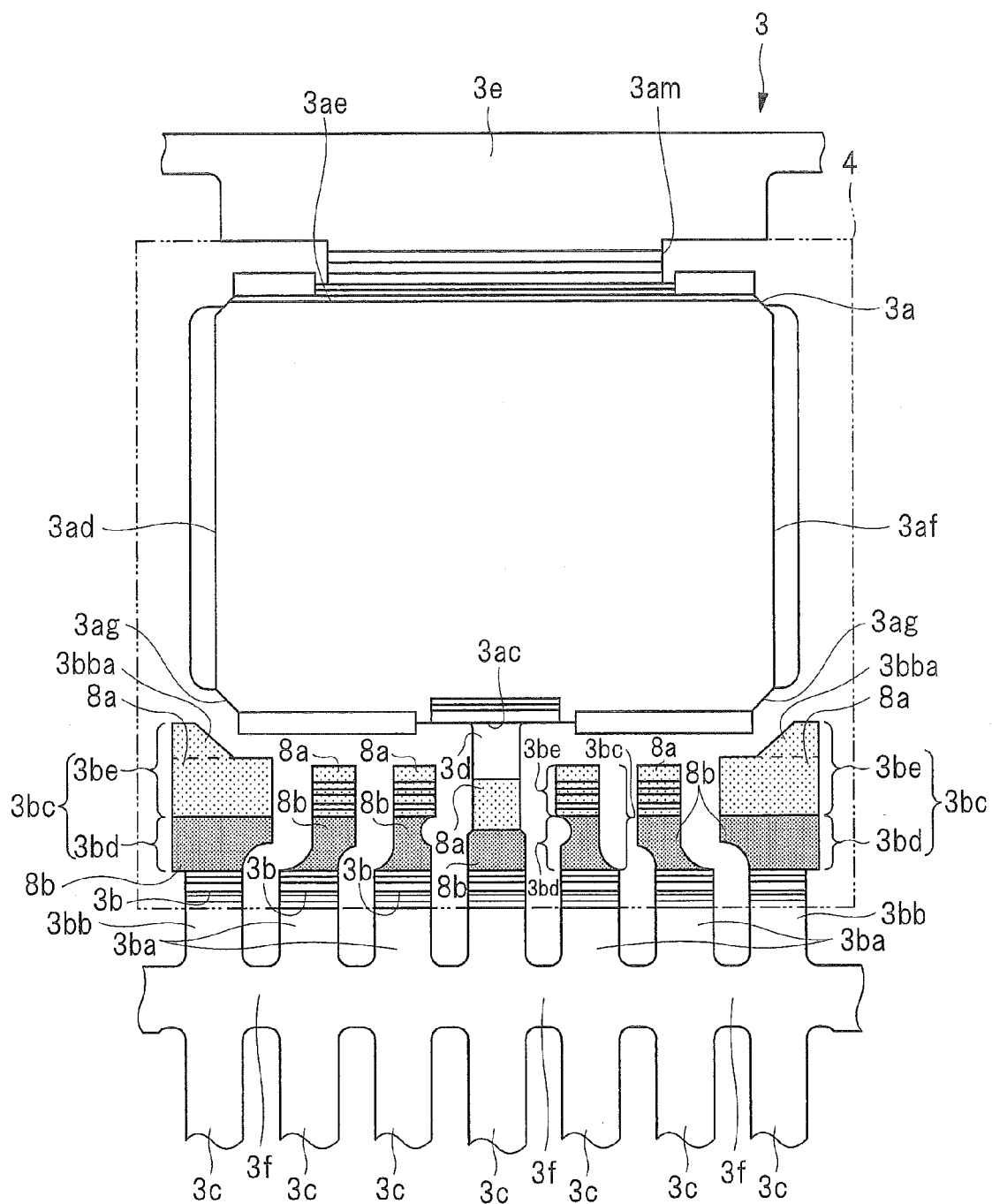
FIG. 15 is a partial plan view illustrating an example of the structure of the lead frame used in the assembly of FIG. 13.
Figure 16:
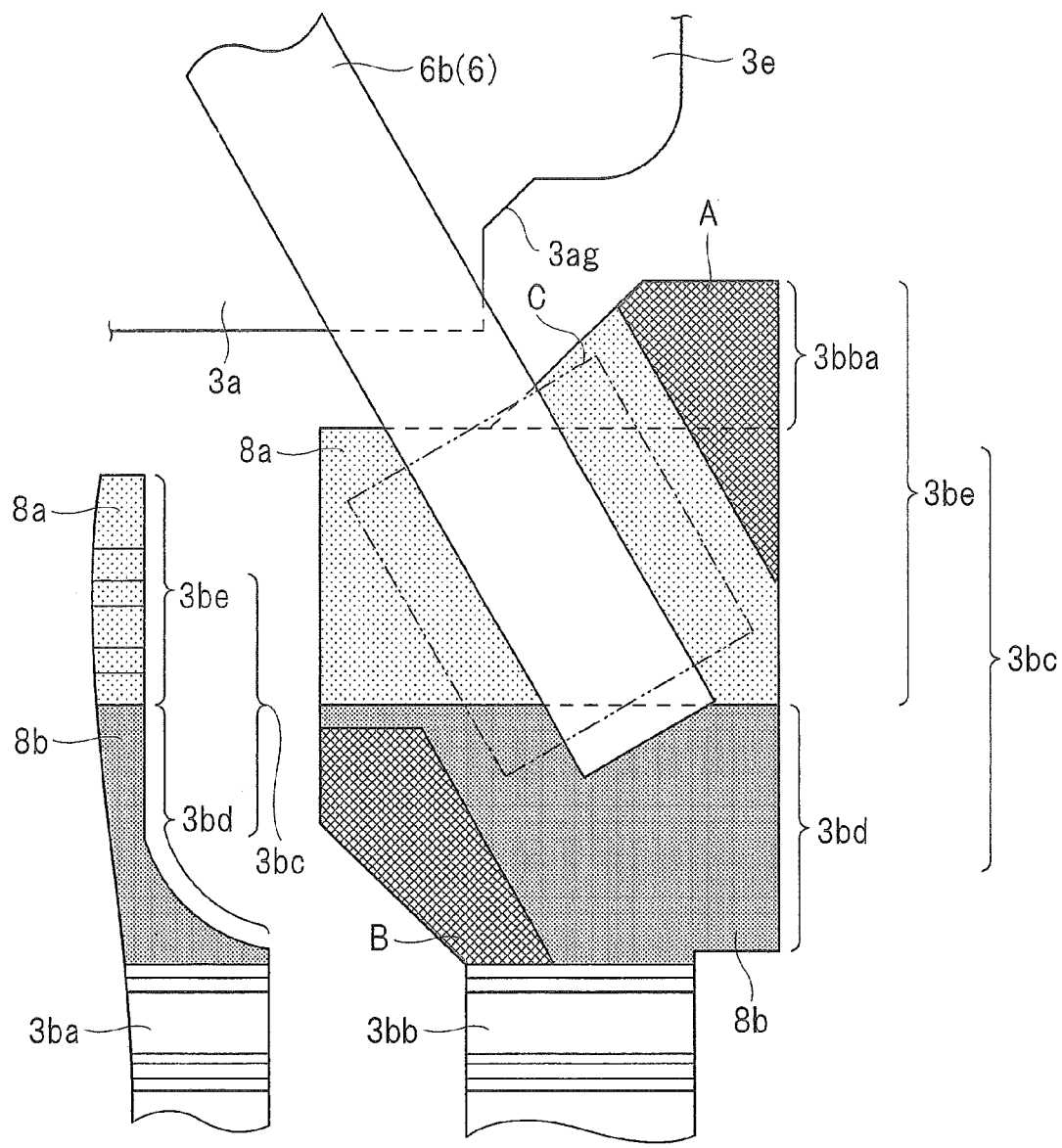
FIG. 16 is an enlarged partial plan view illustrating an example of a clamp area in a wire bonding step of a thick wire of the assembly of the semiconductor device of FIG. 1.

Then, the stamping illustrated in a step S106 is performed, so that the lead frame 3 in which the die pad 3a and the plurality of leads (the inner lead 3b, the outer lead 3c, the suspending lead 3d, etc.) as illustrated in FIG. 15 are formed.

At this time, as illustrated in FIG. 15, the Ag plating 8b is formed on the most outer surface of the first region 3bd of the stitch part 3bc of each inner lead 3b whereas the Ni plating 8a is formed on the most outer surface of the second region 3be of the stitch part 3bc. In this manner, this process prepares the lead frame 3 provided with the die pad 3a which has the upper surface 3aa and the plurality of leads (the inner lead 3b and the outer lead 3c) which are aligned on a side of the die pad 3a and each of which has the stitch part (wire joint part) 3bc at the distal end thereof on the die pad 3a side so that the Ni plating 8a and the Ag plating 8b are formed on each stitch part 3bc.

Meanwhile, in a step different from the formation of the lead frame 3, a non-defective semiconductor chip 1 is obtained by performing wafer pasting illustrated in a step S1 of FIG. 13 and then performing wafer dicing in a step S2 thereof.

Next, die bonding in a step S3 is performed. Here, as illustrated in FIGS. 5 and 6, the semiconductor chip 1 having the surface 1a and the plurality of electrode pads 1c formed on the surface 1a is mounted on the upper surface 3aa of the die pad 3a.

At this time, the semiconductor chip 1 is mounted on the die pad 3a via the die-bonding material 5 such as solder.

Then, Al wire bonding in a step S4 is performed. Here, the second electrode pad 1cb among the plurality of electrode pads 1c of the semiconductor chip 1 and the second lead 3bb among the plurality of inner leads 3b are electrically connected to each other by the Al wire 6b.

Note that each stitch part 3bc of the plurality of inner leads 3b is provided with the second region 3be arranged on the die pad 3a side and the first region 3bd arranged at the position distant from the die pad 3a farther than the second region 3be. Further, the Ag plating 8b is formed on the most outer surface of the first region 3bd of each stitch part 3bc whereas the Ni plating 8a is formed on the most outer surface of the second region 3be of each stitch part 3bc.

Also, the second region 3be of the stitch part 3bc of the second lead 3bb has the extending part 3bba extending in the direction of being closer to the die pad 3a than the second region 3be of the stitch part 3bc of the first lead 3ba.

Figure 17:
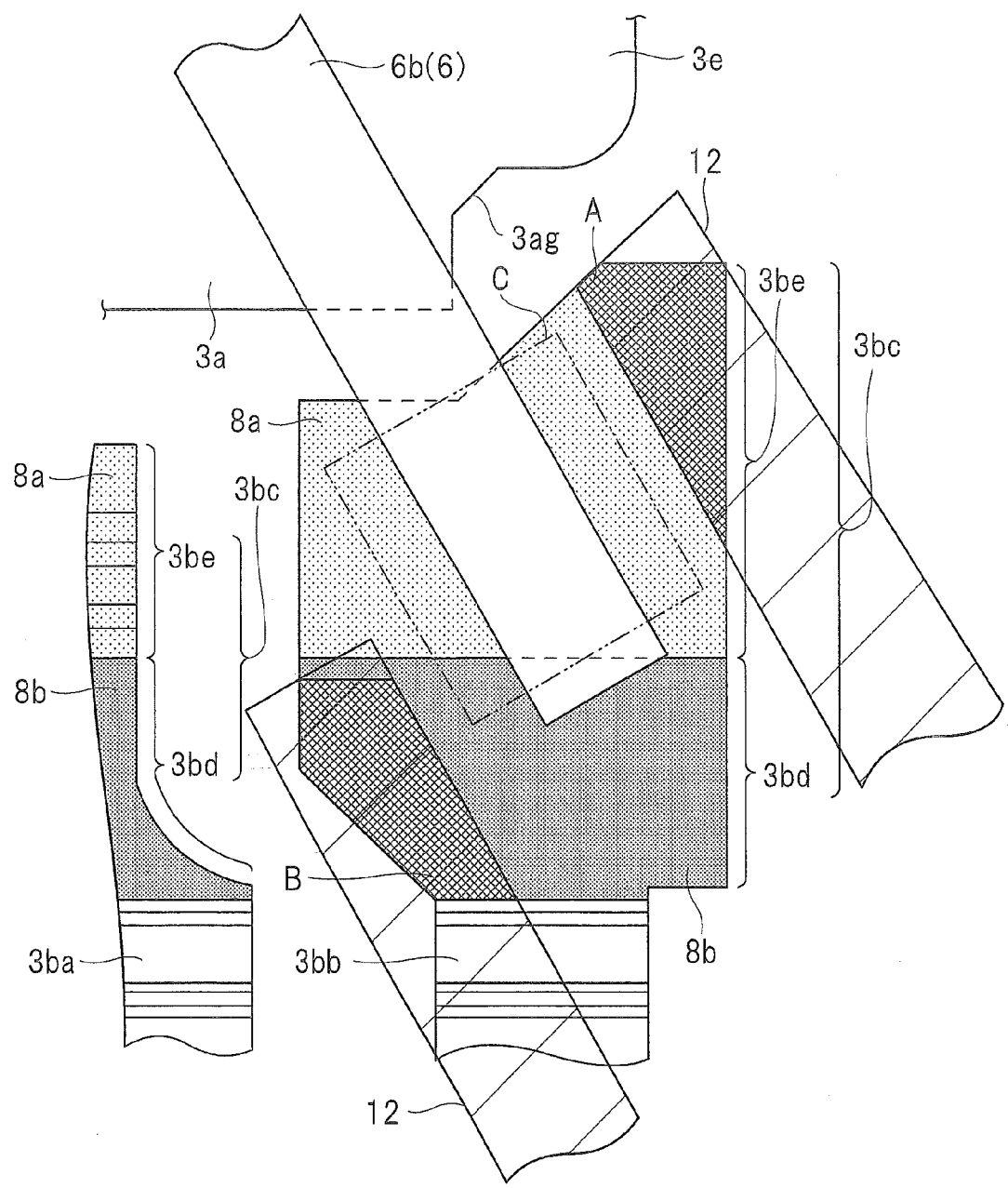
FIG. 17 is an enlarged partial plan view illustrating an example of a state that the thick wire is wire-bonded while pressing the clamp area of FIG. 16.

Accordingly, when the second electrode pad 1cb of the semiconductor chip 1 and the second lead 3bb are electrically connected to each other by the Al wire 6b, the connection is made in a state in which the extending part 3bba of the second region 3be of the stitch part 3bc of the second lead 3bb illustrated in FIG. 16 is pressed by the clamper 12 as illustrated in FIG. 17.

More specifically, the connection of the Al wire 6b is made by the wedge bonding while a clamp area A (hatched part) of the extending part 3bba of the second region 3be of the stitch part 3bc of the second lead 3bb and a clamp area B (hatched part) of the first region 3bd thereof illustrated in FIG. 16 are pressed by the clamper 12 as illustrated in FIG. 17. A region C illustrated in FIGS. 16 and 17 is a portion which is pressed by a wedge tool in the bonding.

In this manner, sufficient ultrasonic waves can be applied also to the Al wire 6b, and therefore, the connection reliability between the Al wire 6b and the second lead 3bb can be enhanced.

Then, Au wire bonding in a step S5 is performed. Here, as illustrated in FIGS. 5 and 6, the first electrode pad 1ca among the plurality of electrode pads 1c of the semiconductor chip 1 and the first region 3bd of the first lead 3ba among the plurality of inner leads 3b are electrically connected to each other by the Au wire 6a. The wire bonding at this time is ball bonding.

That is, the first electrode pad 1ca of the semiconductor chip 1 and the first region 3bd of the stitch part 3bc of the first lead 3ba are electrically connected to each other via the Au wire 6a by the ball bonding. That is, on the 2nd side, the Au wire 6a is connected to the Ag plating 8b of the first region 3bd of the stitch part 3bc of the first lead 3ba.

After the wire bonding, resin sealing (resin molding) in a step S6 is performed. Here, the plurality of inner leads 3b, the suspending lead 3d, apart of the die pad 3a, the semiconductor chip 1, and the plurality of first leads 3ba and second leads 3bb are sealed by a sealing resin to form the sealer 4.

Then, high-temperature storage illustrated in a step S7 is performed. Here, the sealer 4 is hardened by a baking process.

Then, tie-bar cutting illustrated in a step S8 is performed. Here, a tie bar 3f of the lead frame 3 illustrated in FIG. 15 is cut to individually separate the outer leads 3c from each other.

Then, plating formation illustrated in a step S9 is performed to form the exterior plating 9 on the surfaces of the plurality of outer leads 3c protruding from the sealer 4. Further, after the plating formation, singulation illustrated in a step S10 is performed to cut each outer lead 3c and the suspending lead 3d, and besides, to bent each outer lead 3c into the gull-wing shape.

Then, characteristic screening illustrated in a step S11 is performed. Here, the assembled package 7 is subjected to an electrical characteristic test to be distinguished as either a non-defective product or a defective product.

After the characteristic screening, marking illustrated in a step S12 is performed for the package 7 which has been distinguished as the non-defective product. Here, information such as a model number of the product is marked on the surface of the sealer 4 illustrated in FIG. 1.

After the marking, an appearance test of the package 7 is performed by automatic appearance in a step S13.

Then, taping illustrated in a step S14 is performed. Further, taping appearance illustrated in a step S15 is performed for an appearance test of a taping state.

Then, a characteristic test illustrated in a step S16 is performed. Further, packaging illustrated in a step S17 is performed. After the packaging, a packaging test illustrated in a step S18 and storing illustrated in a step S19 are performed, and then, shipping is performed.

According to the semiconductor device (the package 7) of the present embodiment and the method of manufacturing the same, the following effects can be obtained. That is, each stitch part 3bc of the plurality of inner leads 3b has the first region 3bd having the most outer surface on which the Ag plating 8b is applied and the second region 3be having the most outer surface on which the Ni plating 8a is applied. Further, the second region 3be is arranged on the die pad 3a side, and the first region 3bd is arranged at the position (on the periphery side of the sealer 4) distant from the die pad 3a farther than the second region 3be, and therefore, the thick Al wire 6b can be connected to the second region 3be of the second lead 3bb, and the thin Au wire 6a can be connected to the first region 3bd of the first lead 3ba.

That is, in each stitch part 3bc of the plurality of inner leads 3b, the types of the plating applied on the most front surfaces of the first region 3bd and the second region 3be can be differentiated from each other. That is, in the present embodiment, in each stitch part 3bc, the Ni plating 8a is applied on the second region 3be on the die pad 3a side, and the Ag plating 8b is applied on the periphery side of the sealer 4, and therefore, the types of the plating applied on the first region 3bd and the second region 3be of the stitch part 3bc of the lead can be differentiated from each other depending on the type of the wire 6.

As a result, such a problem that only one type of the Au plating is used as the plating formed on each stitch part 3bc can be avoided, and therefore, the cost of the package 7 can be reduced.

Also, each stitch part 3bc of the plurality of leads is provided with the second region 3be arranged on the die pad 3a side and the first region 3bd arranged at the position (on the periphery side of the sealer 4) distant from the die pad 3a, and the second region 3be of the second lead 3bb has the extending part 3bba extending in the direction of being closer to the die pad 3a than the second region 3be of the first lead 3ba.

In this manner, in the wedge bonding of the thick Al wire 6b to the second region 3be of the second lead 3bb, the clamp area to be pressed by the clamper 12 can be ensured in the extending part 3bba.

Therefore, the wire bonding can be stably performed also for the thick Al wire 6b, so that the bonding joint performance can be ensured.

As a result, the reliability of the package 7 can be improved.

Also, even in the package 7 using the wires 6 having the two-type diameters (thicknesses), the number of output leads can be increased without changing the package size thereof, so that the high functionality can be achieved.

This is a countermeasure for solving the following problem.

That is, in a power semiconductor device using the wires having the two types of the thicknesses (diameters) of the thin wire and the thick wire, it is required to increase the number of output leads without changing the package size for the high functionality. However, in this case, a size of the wire joint part (stitch part) of each of the leads is reduced (narrowed) by increasing the number of the leads.

In that case, a thick wire has to be bonded (wedge-bonded) to the narrowed stitch part having a limited size, the securement of the clamp area (area pressed in the wedge bonding) for stably the bonding is insufficient, and therefore, such a problem as unstable wire bonding arises.

That is, in the wedge bonding of the thick wire to the stitch part of the lead, it is required to apply large ultrasonic waves in accordance with the thickness of the wire. However, if the stitch part is not firmly pressed by the clamper, there is a high possibility that large energy of the ultrasonic waves are not sufficiently transmitted to the thick wire, which results in the unstable joint performance of the wire bonding.

For solving this, in the stitch part of the lead to which the thick wire is connected, the clamp area has to be sufficiently ensured to the extent that the pressing by the clamper is possible.

Accordingly, in the wire bonding (wedge bonding) of the assembly step of the semiconductor device of the present embodiment, the clamp area can be ensured in this extending part 3bba by providing the extending part 3bba in the second region 3be of the stitch part 3bc of the second lead 3bb, and, as a result, the wire bonding can be stably performed even for the thick Al wire 6b.

In this manner, bonding joint performance can be ensured, and the reliability of the package 7 can be improved.

Further, as described above, even in the package 7 using the wires 6 having the two types of the diameters (thicknesses), the number of the output leads can be increased without changing the package size, so that the high functionality can be achieved.

Next, modification examples of the present embodiment will be explained.

Figure 18:
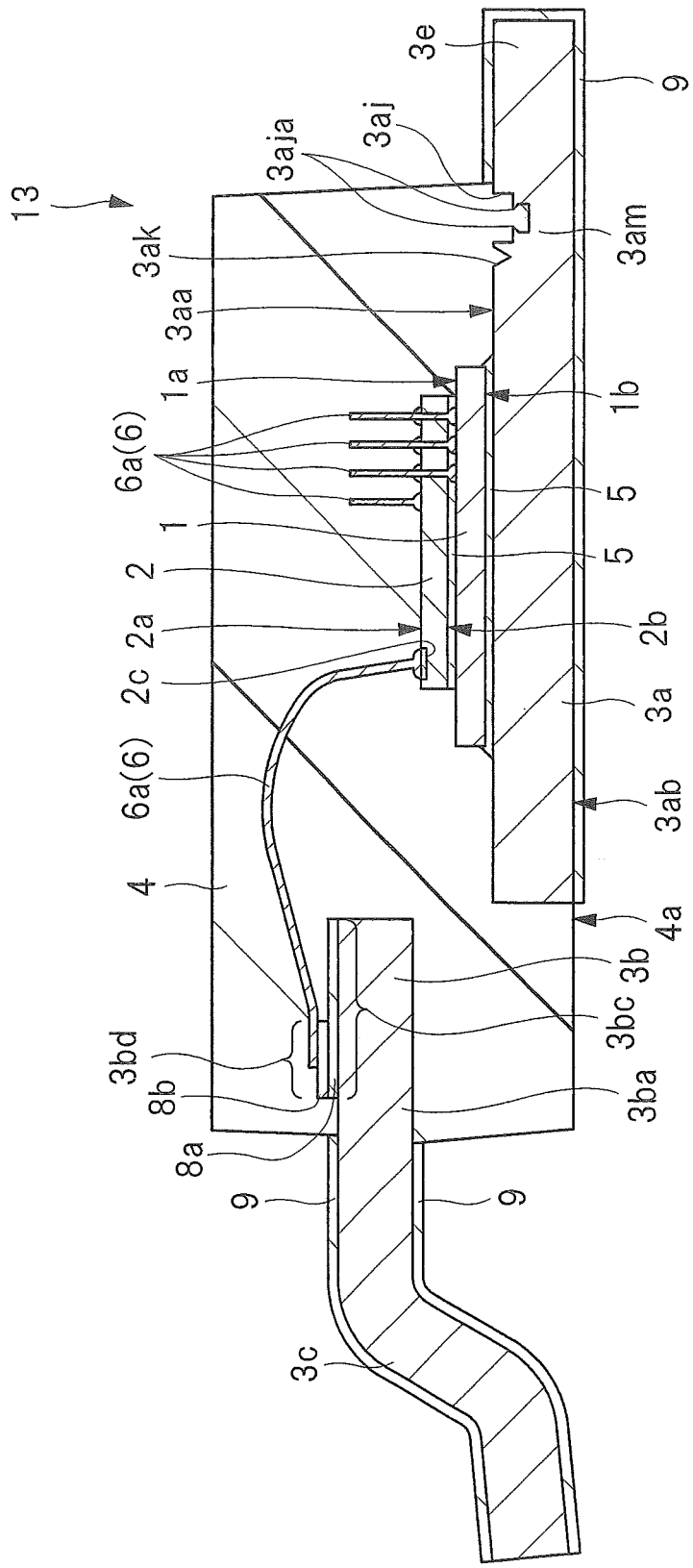
FIG. 18 is a cross-sectional view illustrating a structure of a semiconductor device of a first modification example of the embodiment.
Figure 19:
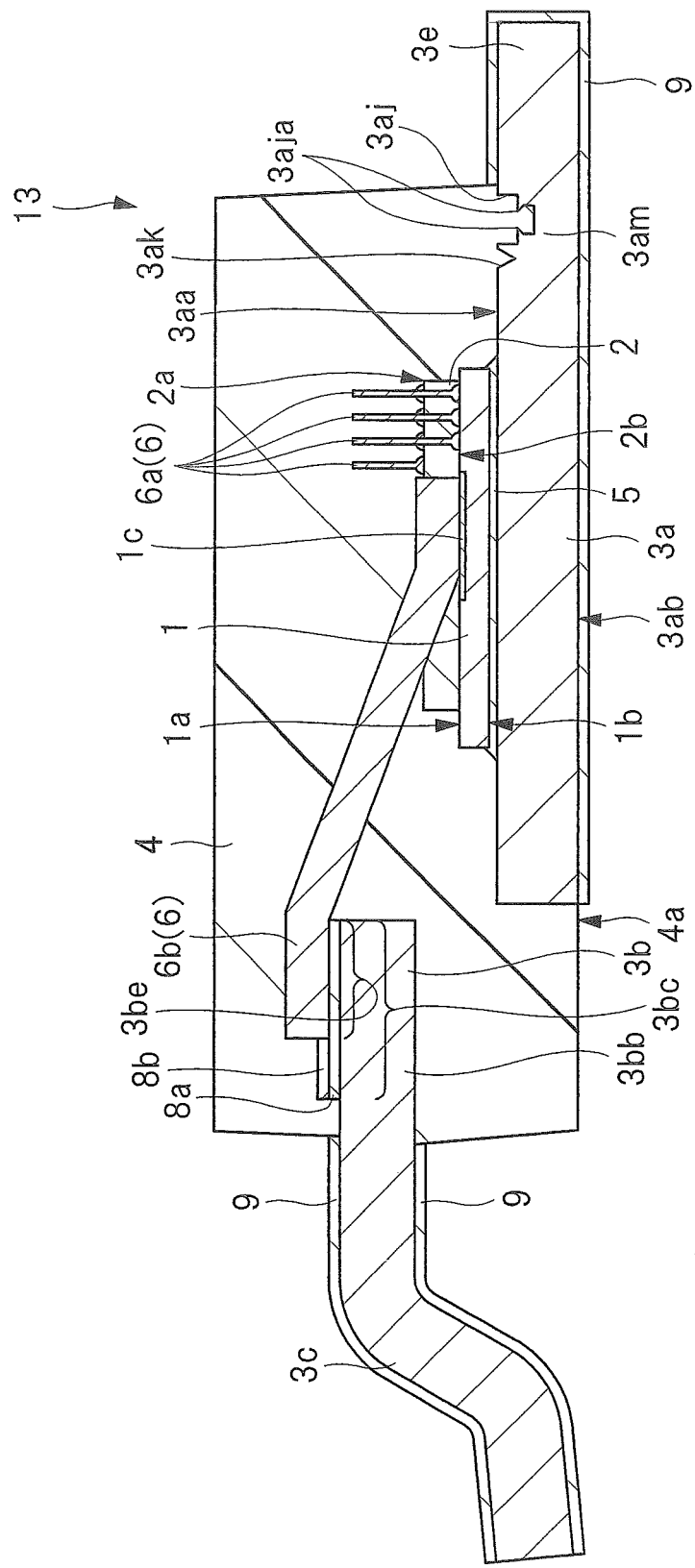
FIG. 19 is a cross-sectional view illustrating another structure of the semiconductor device of the first modification example of the embodiment.
Figure 20:
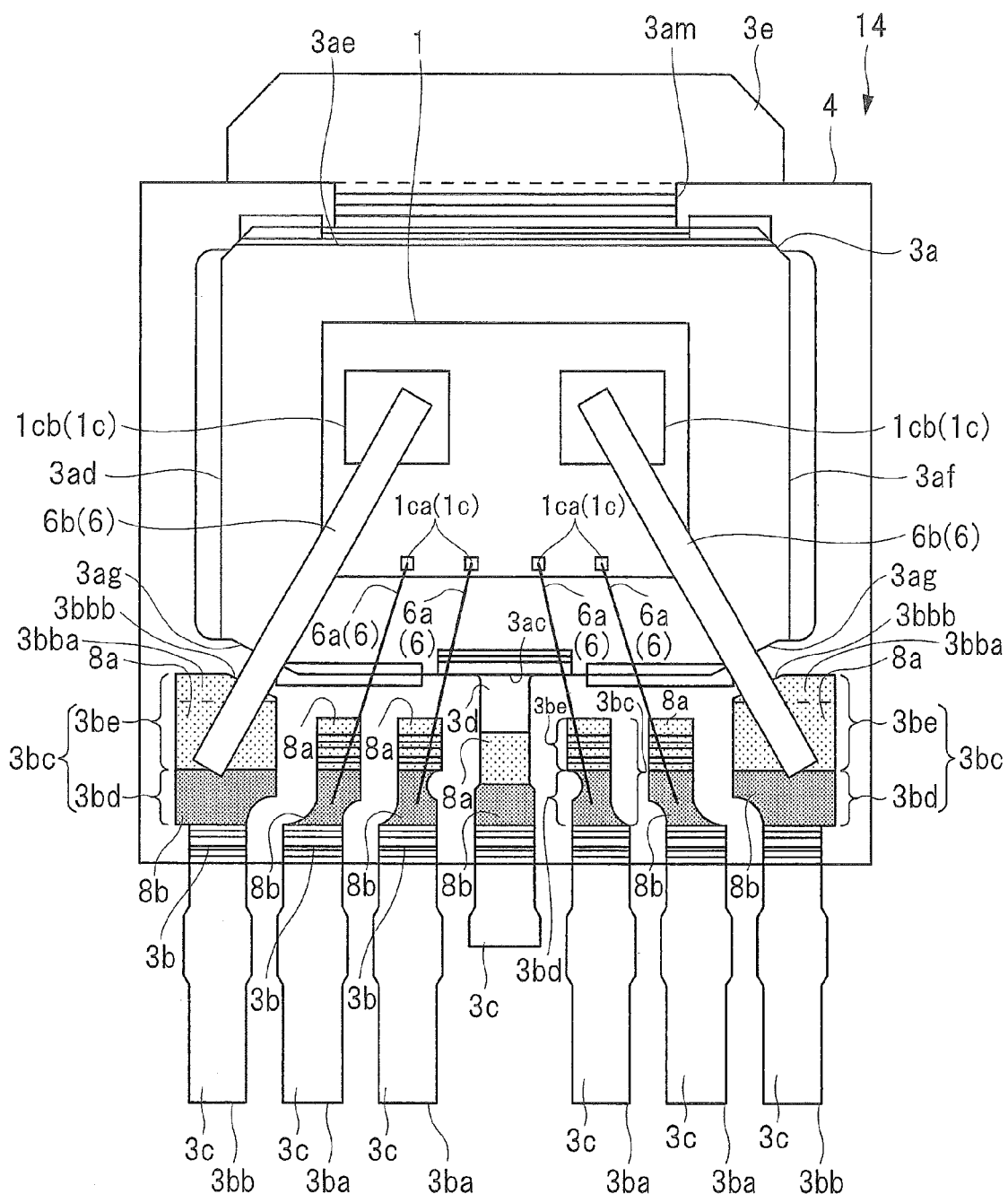
FIG. 20 is a cross-sectional view illustrating a structure of a semiconductor device of a second modification example of the embodiment so that a sealer is transparent.
Figure 21:
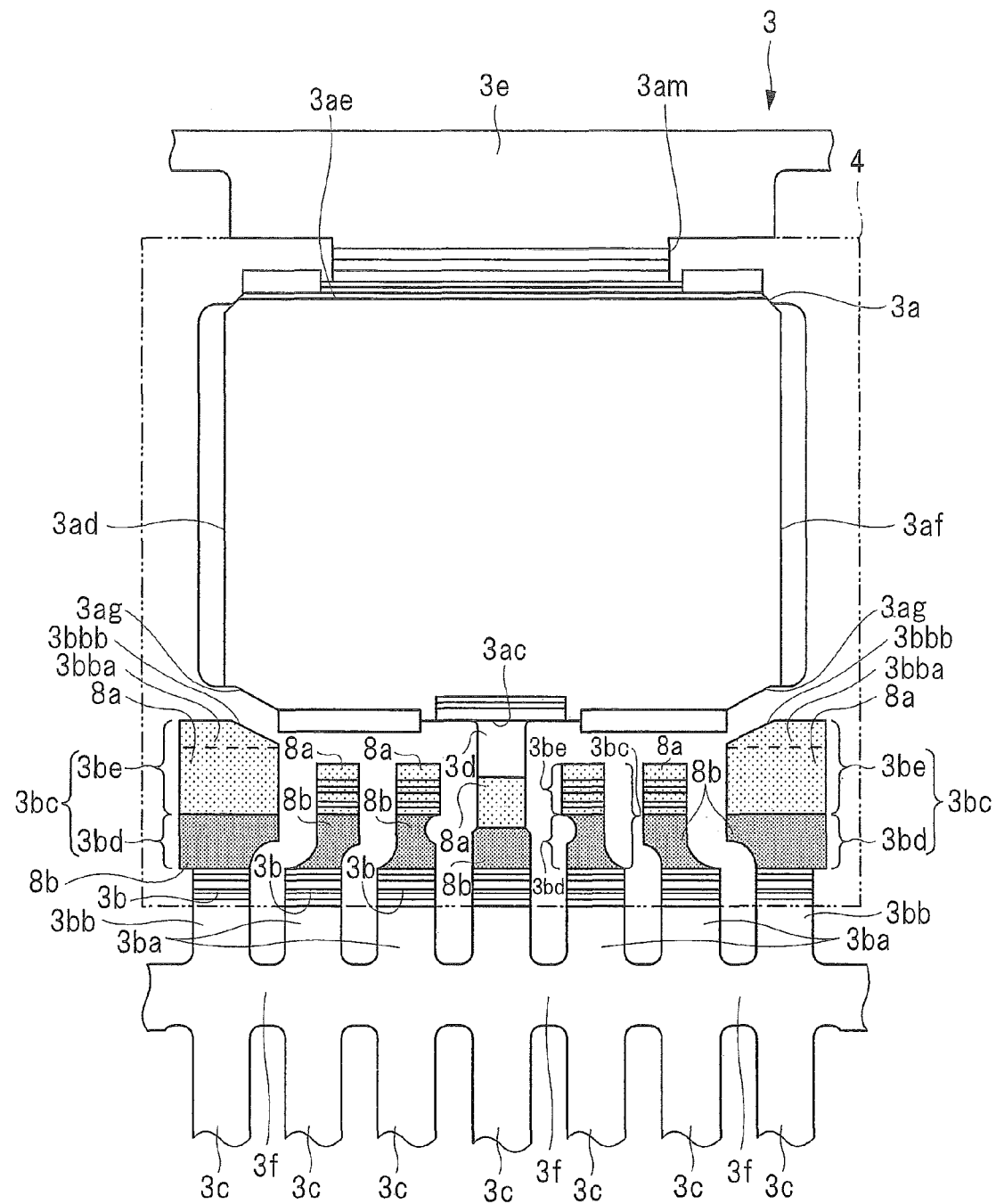
FIG. 21 is a partial plan view illustrating a structure of a lead frame used in assembly of the semiconductor device of FIG. 20.
Figure 22:
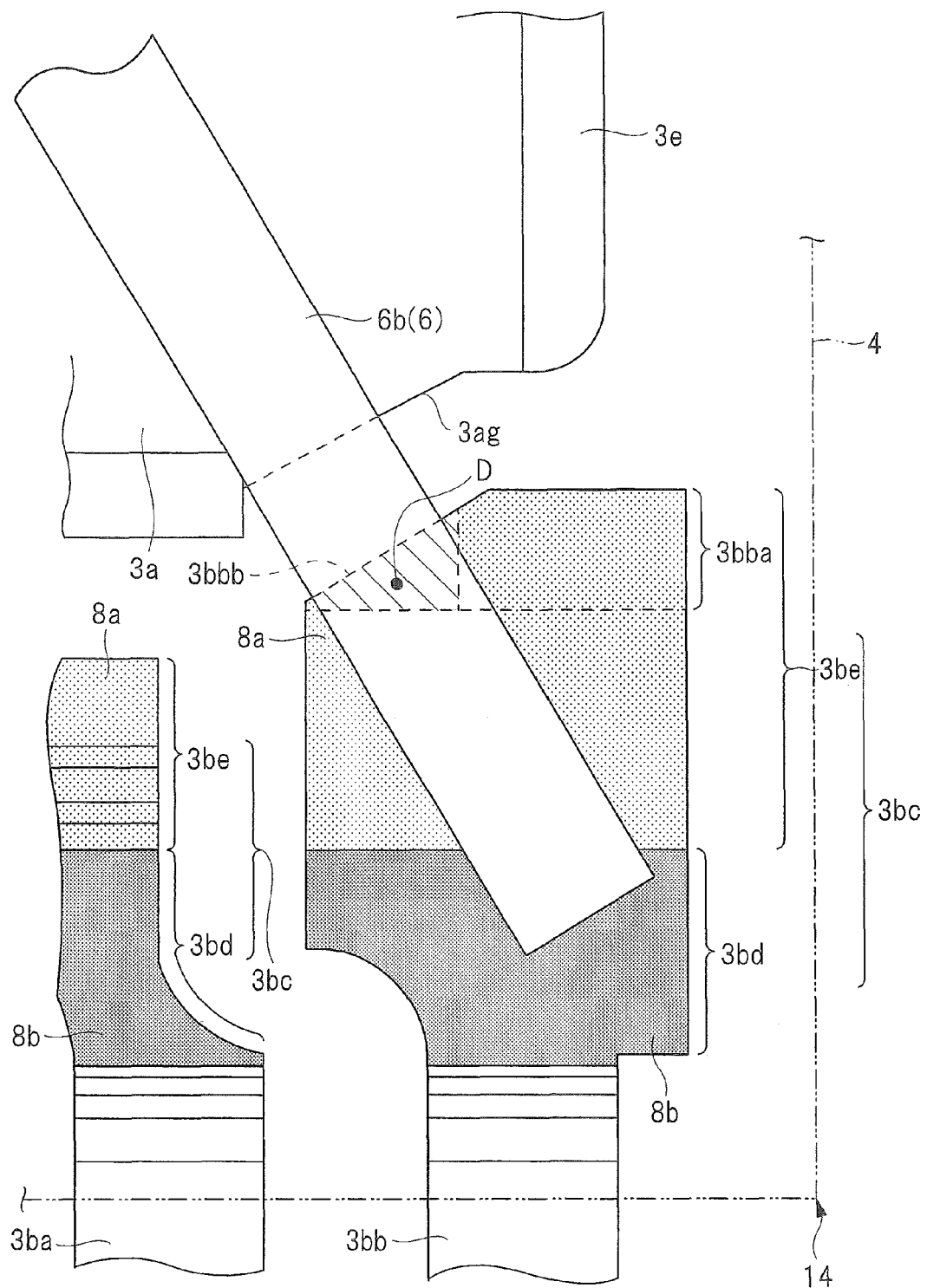
FIG. 22 is an enlarged partial plan view illustrating a bonding state of a thick wire in the semiconductor device of FIG. 20.

FIG. 18 is a cross-sectional view illustrating a structure of a semiconductor device of a first modification example of the embodiment, and FIG. 19 is a cross-sectional view illustrating the structure of the semiconductor device of the first modification example of the embodiment. Further, FIG. 20 is a cross-sectional view illustrating a structure of a semiconductor device of a second modification example of the embodiment so that a sealer is transparent, FIG. 21 is a partial plan view illustrating a structure of a lead frame used in assembly of the semiconductor device of FIG. 20, and FIG. 22 is an enlarged partial plan view illustrating a bonding state of a thick wire in the semiconductor device of FIG. 20.

The first modification example illustrated in FIGS. 18 to 19 is a package 13 having a structure in which a semiconductor chip 2 is stacked above the semiconductor chip 1. That is, this is the package 13 in which the two semiconductor chips 1 and 2 are mounted together so that, for example, the semiconductor chip 1 is a MOSIC whereas the semiconductor chip 2 is a control IC for controlling the MOSIC.

In the package 13, the semiconductor chip 2 is mounted on the semiconductor chip 1, and a back surface 2b of the semiconductor chip 2 is bonded to the surface 1a of the semiconductor chip 1 via the die-bonding material 5 such as a film-shaped adhesive material.

In the package 13, the chips are electrically connected to each other by a plurality of thin (small-diameter) wires of the Au wires 6a.

Also, as illustrated in FIG. 18, an electrode pad 2c formed on a front surface (main surface) 2a of the semiconductor chip 2 in an upper layer is electrically connected to the first region 3bd of the stitch part 3bc of the first lead 3ba (the inner lead 3b) on the periphery side of the sealer 4 via the thin Au wire 6a. On the other hand, as illustrated in FIG. 19, the electrode pad 1c of the front surface 1a of the semiconductor chip 1 in a lower layer is electrically connected to the second region 3be of the stitch part 3bc of the second lead 3bb (the inner lead 3b) on the die pad 3a side via the thick Al wire 6b.

That is, as similar to the package 7, the electrode pad 2c of the semiconductor chip 2 and the Ag plating 8b of the first region 3bd of the stitch part 3bc of the first lead 3ba are electrically connected to each other via the thin Au wire 6a, while the electrode pad 1c of the semiconductor chip 1 and the Ni plating 8a of the second region 3be of the stitch part 3bc of the second lead 3bb are electrically connected to each other via the thick Al wire 6b.

Also in such a package 13, effects similar to those of the package 7 can be obtained.

That is, in each stitch part 3bc, the Ni plating 8a is applied on the second region 3be on the die pad 3a side, and the Ag plating 8b is applied on the periphery side of the sealer 4. In this manner, the types of the plating applied on the first region 3bd and the second region 3be of the stitch part 3bc of the lead can be differentiated from each other in accordance with the type of the wire 6.

As a result, the usage of only one type of Au plating as the plating formed in each stitch part 3bc can be avoided, and therefore, the cost of the package 13 can be reduced.

Also, each stitch part 3bc of the plurality of leads is provided with the second region 3be arranged on the die pad 3a side and the first region 3bd arranged at the position (on the periphery side of the sealer 4) distant from the die pad 3a, and the second region 3be of the second lead 3bb has the extending part 3bba of FIG. 16 extending in the direction of being closer to the die pad 3a than the second region 3be of the first lead 3ba.

In this manner, in the wedge bonding of the thick Al wire 6b to the second region 3be of the second lead 3bb, the clamp area to be pressed by the clamper 12 can be ensured in the extending part 3bba.

Therefore, as similar to the package 7, the wire bonding can be stably performed also for the thick Al wire 6b, so that the bonding joint performance can be ensured.

As a result, the reliability of the package 13 can be improved.

Further, the number of the output leads can be increased without changing the package size thereof even in the package 13 using the wires 6 having the two types of the diameters (thicknesses), so that the high functionality can be achieved.

Next, the second modification example illustrated in FIGS. 20 to 22 is a power package 14 in which only one semiconductor chip 1 is mounted as similar to the package 7 illustrated in FIGS. 1 to 5.

In the package 14, the extending part 3bba of the second lead 3bb has a tilted part 3bbb which is provided at a position opposite to the cut-away part 3*ag* of the die pad 3*a* so as to be tilted in a planar view with respect to the first side 3*ac* opposite to the second lead 3*bb* of the die pad 3*a*. That is, the tilted part 3*bbb* is provided in the extending part 3*bba* of the second region 3*be* of the stitch part 3*bc* of the second lead 3*bb*.

In this manner, by forming the tilted part 3*bbb* in the extending part 3*bba* of the second region 3*be* of the stitch part 3*bc* of the second lead 3*bb* whereas forming the cut-away part 3*ag* at the corner of the die pad 3*a* corresponding to the tilted part 3*bbb*, the contact between the second lead 3*bb* and the die pad 3*a* can be reliably avoided.

Also, as illustrated in FIG. 22, the thick Al wire 6*b* is arranged so as to cross the tilted part 3*bbb* of the extending part 3*bba* of the second lead 3*bb* in a planar view.

By this manner, the Al wire 6*b* can be arranged so as to cross the tilted part 3*bbb* of the extending part 3*bba* of the second lead 3*bb* since the Al wire 6*b* is arranged so as to expand from the second electrode pad 1*cb* of the semiconductor chip 1 toward the second lead 3*bbb*.

As a result, the tilted part 3*bbb* of the extending part 3*bba* of the second lead 3*bb* is arranged below (in a "D" part (hatched line part) in FIG. 22 of) the Al wire 6*b*, and therefore, an area of a connection part of the Al wire 6*b* to the stitch part 3*bc* of the second lead 3*bb* can be largely ensured, and the connection reliability between the Al wire 6*b* and the second lead 3*bb* can be further enhanced.

Note that other effects obtained by the package 14 are similar to those of the package 7 and the package 13, and therefore, repetitive explanations thereof will be omitted.

In the foregoing, the invention made by the present inventor has been concretely described based on the embodiments. However, it is needless to say that the present invention is not limited to the foregoing embodiments and various modifications and alterations can be made within the scope of the present invention.

For example, in the above-described embodiments, the case in which the number of the output leads in the semiconductor device (the package 7, 13, or 14) is seven has been explained. However, it is needless to say that the number of the output leads may be eight or larger.

Also, in the above-described embodiments, in the above-described semiconductor device, the case of the structure in which the lower surface 3*ab* of the die pad 3*a* is exposed from the back surface 4*a* of the sealer 4 has been explained. However, the above-described semiconductor device may have a structure in which (a part of or) the lower surface 3*ab* of the die pad 3*a* is not exposed from the sealer 4.

What is claimed is:

1. A method of manufacturing a semiconductor device, the method comprising:
   preparing a lead frame provided with a die pad having an upper surface and a plurality of leads being arranged so as to be aligned on a side of the die pad and each including a wire joint part at a distal end on the side of the die pad;
   after said preparing the lead frame, mounting a semiconductor chip having a main surface and a plurality of electrode pads formed on the main surface, on the upper surface of the die pad; and
   after said mounting the semiconductor chip, electrically connecting a first electrode pad among the plurality of electrode pads of the semiconductor chip and a first lead among the plurality of leads to each other via a first wire, and electrically connecting a second electrode pad among the plurality of electrode pads of the semiconductor chip and a second lead among the plurality of leads to each other via a second wire,
   wherein the wire joint part of each of the plurality of leads includes a second region arranged on the side of the die pad and a first region arranged at a position distant from the die pad farther than the second region,
   wherein the second region of the wire joint part of the second lead includes an extending part extending in a direction of being closer to the die pad than the second region of the wire joint part of the first lead, and
   wherein, in said electrically connecting the first electrode pad and the first lead, and in said electrically connecting the second electrode pad and the second lead, in connection of the first wire to the first region of the first lead, connection of the second wire to the second region of the second lead, and electrical connection of the second wire to the second region of the second lead, the connection is made in a state in which the extending part of the second region of the wire joint part of the second lead is pressed by a clamper.

2. The method of manufacturing the semiconductor device according to claim 1, wherein a first plating is applied on a most outer surface of the first region of the wire joint part of each of the plurality of leads, and a second plating is applied on a most outer surface of the second region of the wire joint part of each of the plurality of leads.

3. The method of manufacturing the semiconductor device according to claim 2, wherein the first plating and the second plating are formed on the lead frame by a stripe plating method before the die pad and the plurality of leads are formed.

4. The method of manufacturing the semiconductor device according to claim 3, wherein the first plating includes a Ag plating, and the second plating includes a Ni plating.

\* \* \* \* \*